(12) United States Patent
Gandhi et al.

(10) Patent No.: US 12,416,961 B2
(45) Date of Patent: Sep. 16, 2025

(54) INTEGRATED CIRCUIT THAT MITIGATES INDUCTIVE-INDUCED VOLTAGE DROOP USING COMPUTE UNIT GROUP IDENTIFIERS

(71) Applicant: SambaNova Systems, Inc., Palo Alto, CA (US)

(72) Inventors: Darshan Gandhi, Palo Alto, CA (US); Manish K. Shah, Austin, TX (US); Raghu Prabhakar, San Jose, CA (US); Gregory Frederick Grohoski, Bee Cave, TX (US); Youngmoon Choi, Milpitas, CA (US); Jinuk Shin, San Jose, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 243 days.

(21) Appl. No.: 18/132,392

(22) Filed: Apr. 8, 2023

(65) Prior Publication Data

US 2024/0094794 A1    Mar. 21, 2024

Related U.S. Application Data

(60) Provisional application No. 63/405,363, filed on Sep. 9, 2022.

(51) Int. Cl.
*G06F 1/3206* (2019.01)
*G06F 1/08* (2006.01)

(52) U.S. Cl.
CPC .............. *G06F 1/3206* (2013.01); *G06F 1/08* (2013.01)

(58) Field of Classification Search
None
See application file for complete search history.

(56) References Cited

U.S. PATENT DOCUMENTS 6,127,746 A    10/2000    Clemente
2005/0289499 A1    12/2005    Ogawa et al.
(Continued)

FOREIGN PATENT DOCUMENTS

WO    2010142987 A1    12/2010

OTHER PUBLICATIONS

U.S. Appl. No. 18/132,393—Final Rejection dated Oct. 24, 2024, 9 pages.

(Continued)

*Primary Examiner* — Paul Yen
(74) *Attorney, Agent, or Firm* — Flagship Patents; Sikander M. Khan; Bruce A. Young

(57) ABSTRACT

An integrated circuit (IC) includes an array of statically reconfigurable compute units for separation into mutually exclusive groups. Each group includes statically reconfigurable number of compute units. Each compute unit includes a register statically reconfigurable with a group identifier that identifies which group the compute unit belongs to, a counter statically reconfigurable to synchronously increment with the counters of all the other compute units such that all the counters have the same value each clock cycle, and control circuitry that prevents the compute unit from starting to process data until the counter value matches the identifier. According to operation of the register, the counter, and the control circuitry, no more than the statically reconfigurable number of the compute units are allowed to start processing data concurrently to mitigate supply voltage droop caused by a time rate of change of current drawn by the IC through inductive loads of the IC.

26 Claims, 23 Drawing Sheets

(56) References Cited

U.S. PATENT DOCUMENTS

| | | |
|---|---|---|
| 2009/0063065 A1 | 3/2009 | Weekly |
| 2009/0112550 A1 | 4/2009 | Aikawa et al. |
| 2011/0131321 A1* | 6/2011 | Black .................... H04L 67/59 709/224 |
| 2014/0157277 A1 | 6/2014 | Eisen et al. |
| 2014/0365750 A1 | 12/2014 | Shirvani et al. |
| 2015/0106645 A1* | 4/2015 | Breuer .................. A61B 6/032 713/400 |
| 2019/0041942 A1 | 2/2019 | Keceli et al. |
| 2019/0267806 A1 | 8/2019 | Scott et al. |
| 2019/0339757 A1 | 11/2019 | Roy et al. |
| 2019/0341843 A1 | 11/2019 | Xu et al. |
| 2024/0085965 A1 | 3/2024 | Gandhi et al. |
| 2024/0085966 A1 | 3/2024 | Gandhi et al. |
| 2024/0085967 A1 | 3/2024 | Gandhi et al. |
| 2024/0094794 A1 | 3/2024 | Gandhi et al. |

OTHER PUBLICATIONS

U.S. Appl. No. 18/132,393—Non-Final Rejection dated Jul. 25, 2024, 9 pages.
List of Related cases, dated Apr. 16, 2024, 2 pages.
M. Emani et al., Accelerating Scientific Applications With Sambanova Reconfigurable Dataflow Architecture, in Computing in Science & Engineering, vol. 23, No. 2, pp. 114-119, Mar. 26, 2021, [doi: 10.1109/MCSE.2021.3057203].
Podobas et al, A Survey on Coarse-Grained Reconfigurable Architectures From a Performance Perspective, IEEEAccess, vol. 2020. 3012084, Jul. 27, 2020, 25 pages.

* cited by examiner 700, 710

User Program Statements

```
Linear = torch.nn.Linear(K, N)
Relu = torch.nn.relu
Softmax = torch.nn.Softmax(dim=3)
X1 = torch.randn(N, C, M, K)
X2 = %1.to("RDP")
X3 = Linear(X2)
X4 = Relu(X3)
X5 = Softmax(X4)
X6 = X5.to("CPU")
```

750

User Program Computation Graph

RandN →X1→ To →X2→ Linear →X3→ ReLU →X4→ Softmax →X5→ To →X6

800

Air/Tensor Statements

%1 = air.Input(name: "In0");
%2 = air.Linear(%1);
%3 = air.ReLU(%2);
%4 = air.Exp(%3);
%5 = air.Sum(%4, dim: 3);
%6 = air.Div(%4, %5);
%7 = air.Output(%6)

Tensor Size

NxCxMxK bf16
NxCxMxN bf16
NxCxMxN bf16
NxCxMxN bf16    ⎫
NxCxMx1 bf16    ⎬ Softmax lowering
NxCxMxN bf16    ⎭

850

Air/Tensor Computation Graph

```
Template Dataflow Statements                          Tensor Size
%1 = tlir.Region(name: "In0"):                        NxCxMxK bf16
%2 = tlir.Region(name: "Weight"):                     KxN bf16
%3 = tlir.Region(name: "Bias"):                       1xN bf16
%4 = tlir.Region(name: "Out0"):                       NxCxMxN bf16
%5 = tlir.Load(%2)
%6 = tlir.Load(%3)
%7 = tlir.MetaPipeline(iters: N) {
  %8 = tlir.Load(%1, dim: 1):                         CxMxK bf16
  %9 = tlir.Buffer(%5, depth: 2):                     CxMxK bf16
  %10 = tlir.MetaPipeline(iters: C) {
    %11 = tlir.ReadSlice(%9, dim: 1):                 MxK bf16
    %12 = tlir.Linear(%5, %11):                       MxN bf16
    %13 = tlir.Buffer(%12, depth: 2):                 MxN bf16
    %14 = tlir.AddBias(%13, %6):                      MxN bf16
    %15 = air.ReLU(%14):                              MxN bf16
    %16 = air.Exp(%15):                               MxN bf16
    %17 = tlir.Buffer(%16, depth: 2):                 MxN bf16
    %18 = tlir.Sum(%17, dim: 1):                      Mx1 bf16
    %19 = tlir.Div(%17, %18):                         MxN bf16
    %20 = tlir.Store(%4, %19)
  }
}
```

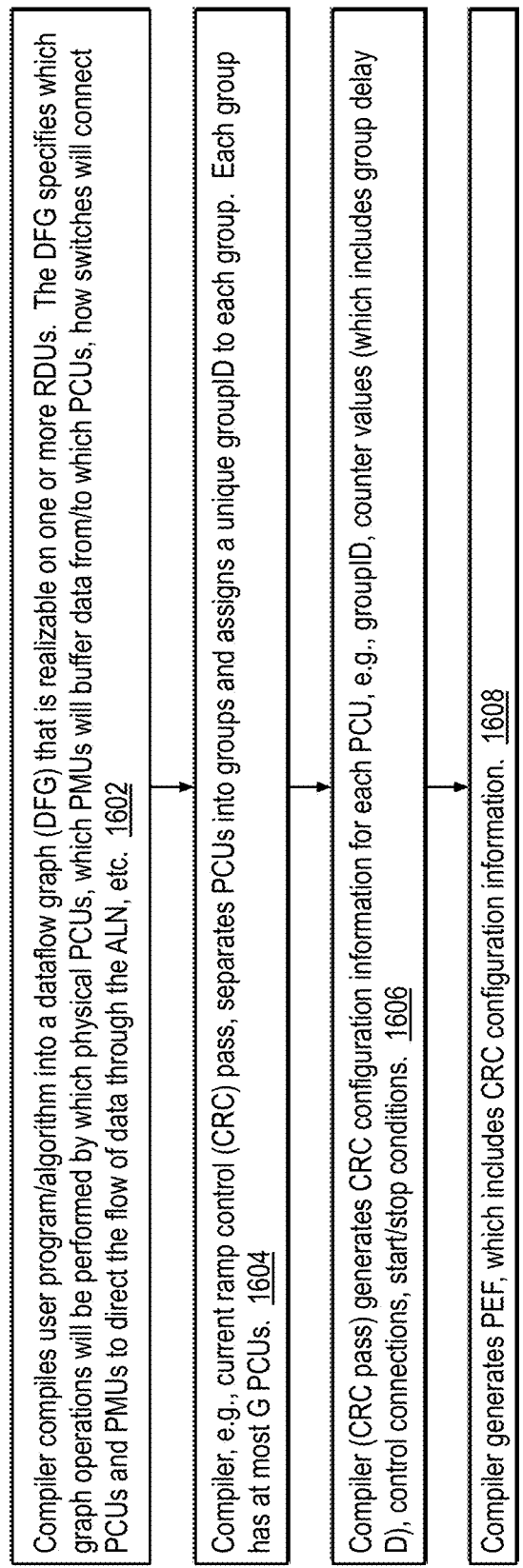

Compiler compiles user program/algorithm into a dataflow graph (DFG) that is realizable on one or more RDUs. The DFG specifies which graph operations will be performed by which physical PCUs, which PMUs will buffer data from/to which PCUs, how switches will connect PCUs and PMUs to direct the flow of data through the ALN, etc. 1602

Compiler, e.g., current ramp control (CRC) pass, separates PCUs into groups and assigns a unique groupID to each group. Each group has at most G PCUs. 1604

Compiler (CRC pass) generates CRC configuration information for each PCU, e.g., groupID, counter values (which includes group delay D), control connections, start/stop conditions. 1606

Compiler generates PEF, which includes CRC configuration information. 1608

INTEGRATED CIRCUIT THAT MITIGATES INDUCTIVE-INDUCED VOLTAGE DROOP USING COMPUTE UNIT GROUP IDENTIFIERS

CROSS REFERENCE TO RELATED APPLICATION(S)

This application claims priority based on U.S. Provisional Application, Ser. No. 63/405,363, filed Sep. 9, 2022, entitled METHOD AND APPARATUS FOR L DI/DT MITIGATION TO PREVENT UNDERVOLTAGE UTILIZING STAGGERED RAMP UP, which is hereby incorporated by reference in its entirety.

This application is related to the following U.S. Non-Provisional Applications filed concurrently herewith each of which is hereby incorporated by reference in its entirety:

Ser. No. 18/132,390, entitled "INTEGRATED CIRCUIT THAT MITIGATES INDUCTIVE-INDUCED VOLTAGE DROOP", filed on Apr. 8, 2023.

Ser. No. 18/132,393, entitled "COMPILER THAT GENERATES CONFIGURATION INFORMATION FOR CONFIGURING AN INTEGRATED CIRCUIT TO MITIGATE INDUCTIVE-INDUCED VOLTAGE DROOP", filed on Apr. 8, 2023.

Ser. No. 18/132,394, entitled "INTEGRATED CIRCUIT THAT MITIGATES INDUCTIVE-INDUCED VOLTAGE OVERSHOOT", filed on Apr. 8, 2023.

BACKGROUND

Power supplies provide power to a load such as a digital integrated circuit. The power supplies, including accompanying voltage regulators, attempt to provide a relatively constant supply voltage to the integrated circuit. The active devices on the integrated circuit, e.g., transistors, are designed to operate using the supply voltage, e.g., at the terminal of a complementary metal-oxide semiconductor (CMOS) field effect transistor (FET), within some tolerance. However, if the supply voltage to the transistor drops below a minimum threshold, the transistor may cease to operate properly, and the integrated circuit may operate incorrectly and exhibit failures. For example, combinatorial logic that comprises the transistor may not meet the timing requirements to generate a result that is to be latched into a register/flip-flop or the register/flip-flop may not properly latch the result of the combinatorial logic. The phenomenon of a drop in the value of the supply voltage may be referred to as voltage droop.

A known cause of voltage droop is inductive loads, or more specifically, a large rate of change of current drawn through the inductive loads, which may be referred to as a large current ramp. As is well known, the voltage drop across an inductive load is the product of the inductance of the load and the time rate of change of the current drawn through the inductive load, which may be expressed in equation (1) below in which L is the inductance of the load and di/dt is the first derivative of the current with respect to time through the load.

$$V_{inductive} = L * \frac{di}{dt} \quad (1)$$

The inductive loads may take various forms, including contacts of the integrated circuit (e.g., bumps or balls of a ball grid array) with a circuit board upon which the integrated circuit is mounted and inductive loads within the integrated circuit. The inductive loads are effectively in series between the voltage supply and the transistors of the integrated circuit. Thus, any voltage drop across the inductive loads reduces the supply voltage at the transistors of the integrated circuit below the supply voltage provided by the power supply per equation (2), ignoring non-inductive voltage drop sources.

$$V_{transistor} = V_{power\ supply} - V_{inductive} \quad (2)$$

When the transistors of the integrated circuit in the aggregate are drawing a relatively constant amount of current over time from the power supply through the inductive loads, per equation (1) the voltage drop across the inductive loads may be relatively small since the time rate of change of the current is relatively small or close to zero, i.e., the current ramp is very flat. In this case, the voltage drop across the inductive loads is relatively small such that the supply voltage provided to the transistors will be substantially the supply voltage provided by the power supply per equation (2) (again, non-inductive voltage drop sources). However, when the integrated circuit begins to draw significantly more current over a relatively short amount of time, this time rate of change of the current may become large enough to induce a sufficiently large voltage across the inductive loads that the supply voltage provided to the transistors may be substantially below the supply voltage provided by the power supply and, more importantly, may be below the minimum threshold needed by the transistors to operate correctly. Operational failures caused by large rates of change of current drawn through the inductive loads may be particularly likely in integrated circuits with high degrees of parallelism in which many computation units may start up at the same time.

A known solution to the voltage droop problem is clock stretching in which the clock cycle of the integrated circuit is lengthened to reduce the time rate of change of the current drawn by the integrated circuit across the inductive loads. However, this solution negatively affects the performance of the integrated circuit. Additionally, there is a cost associated with the additional circuitry that achieves the clock stretching, particularly if circuitry to sense the high rate of change of current is included to detect the need for stretching the clock in a dynamic fashion.

Finally, a complementary voltage overshoot problem may occur per equation (1) above if a negative time rate of change of the current occurs, i.e., a downward current ramp due to transition from activity to inactivity, i.e., a negative value of di/dt, which may cause a negative voltage across the inductive loads, which may cause the supply voltage to the transistors to overshoot above a maximum threshold, which may also cause operational failures of the integrated circuit.

BRIEF DESCRIPTION OF THE DRAWINGS

FIGS. 9A and 9B, referred to collectively as FIG. 9, show the user program in an example third phase of the compiler stack.

FIG. 16 is an example flowchart illustrating operation of the compiler to generate configuration information with which to statically reconfigure a SRDAP to perform CRC in accordance with embodiments of the present disclosure.

Figure 1:
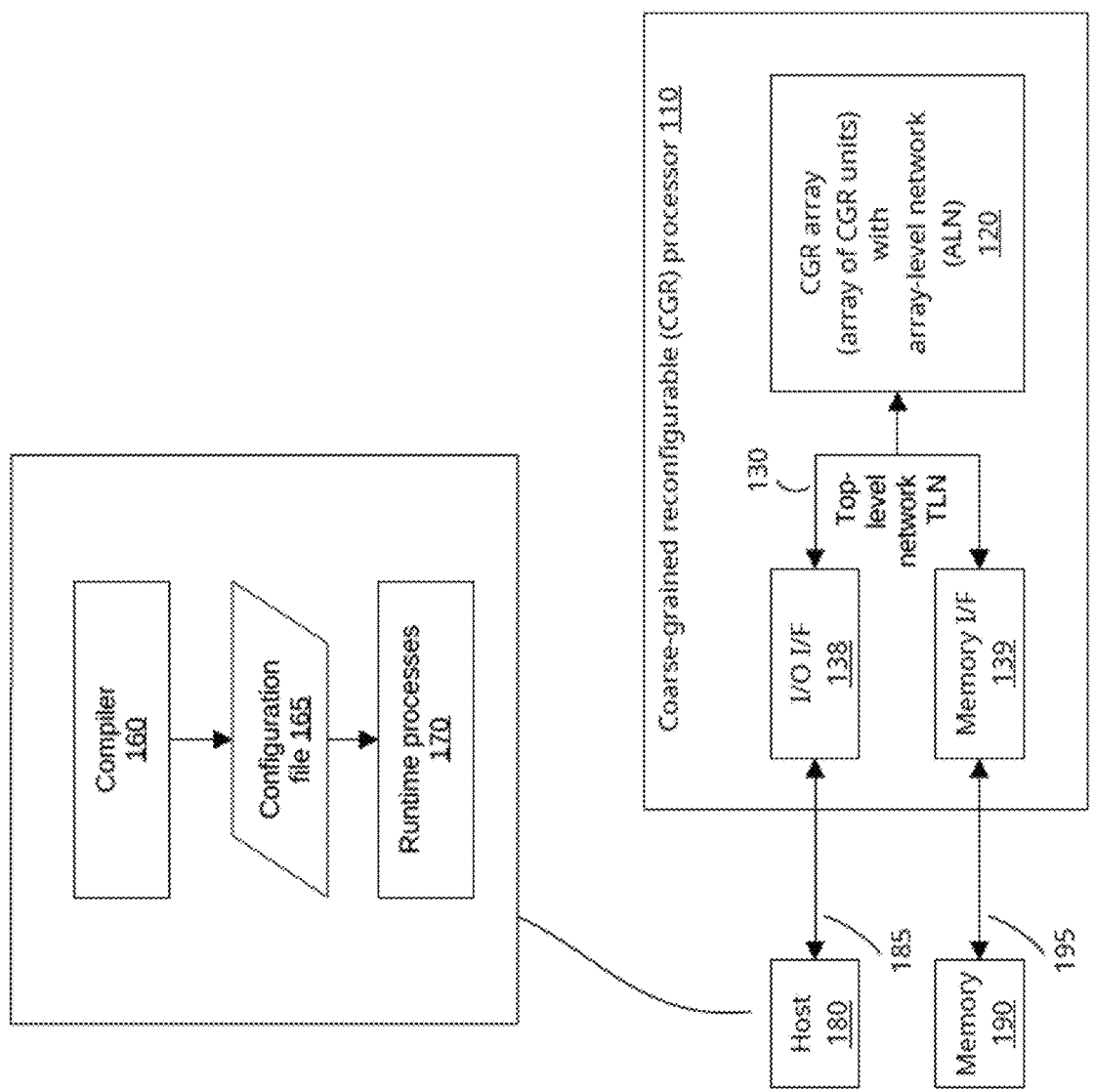
FIG. 1 illustrates an example system including an integrated circuit (IC), a host, and a memory.

In the figures, like reference numbers may indicate functionally similar elements. The systems and methods illustrated in the figures, and described in the Detailed Description below, may be arranged and designed in a wide variety of different implementations. Neither the figures nor the Detailed Description are intended to limit the scope of the claims. Instead, they merely represent examples of different implementations of the disclosed technology.

DETAILED DESCRIPTION

Embodiments are disclosed of an integrated circuit having an array of many compute units capable of processing data at a high level of parallelism such as may be employed to accelerate neural network processing and other deep learning applications. The integrated circuit includes control circuitry that enforces the paradigm that within a given window of time, only a subset of the many compute units, i.e., less than all the compute units, may be allowed to concurrently transition from not processing data to processing data. In other words, a delay may be enforced between the startup of one subset of compute units and the startup of the next subset of compute units. In this sense, the startup of the compute units is staggered in time. The subsets of compute units may also be referred to as groups of compute units. The control circuitry may also detect when a compute unit is inactive for a number of clock cycles—which makes it capable of contributing to the current ramp when starting to process data again—and make the compute unit delay its startup again until its group becomes eligible again. The number of compute units in a group, the number of clock cycles of the delay, and the number inactive clock cycles may be based on various factors that include, but are not limited to: the design of the compute units, e.g., number of pipeline stages, number of parallel pipelines, data word widths, operations the compute unit may be reconfigured to perform; characteristics of the inductive load through which the current is being drawn whose rate of change causes the voltage droop/overshoot, which may be a function of conductor length, location and shape; characteristics and capabilities of the power supply and/or voltage regulators that provide power to the integrated circuit, such as time needed to recover from a sudden current ramp; and/or the voltage thresholds required by the active components of the integrated circuit. Some or all the factors and/or number of compute units per group, delay clock cycles, and inactive clock cycles may be determined empirically and/or through circuit simulation, for example.

The control circuitry may be statically reconfigured with configuration information, also referred to as configuration data, prior to the initiation of data processing by the compute units to enforce the paradigm, e.g., with the delay information and information used to identify the group to which each compute unit belongs. The control circuitry may be distributed within each compute unit. The control circuitry may be further distributed within a network of switches that connect the compute units and control the flow of data within the array. The control circuitry may be further distributed within memory units within the array that buffer data to and/or from the compute units. The paradigm enforced by the control circuitry may be referred to as current ramp control (CRC) since it controls the current ramp—i.e., the time rate of change of the current drawn by the integrated circuit, or the first derivative of the current with respect to time, di/dt—to mitigate operational failures that might otherwise be caused by voltage droop/overshoot.

A compiler takes a user program/algorithm that describes how the data is to be processed and transforms the program/algorithm into a dataflow graph that includes operations needed to accomplish the user program/algorithm and the flow of data between the operations. The output of the compiler may include configuration information that maps the operations of the dataflow graph to the compute units in addition to the CRC configuration information. The compiler may analyze the dataflow graph to decide how to group the compute units to reduce any negative performance impact that might be caused by the CRC. Thus, programmatic solutions to the inductive load-induced voltage droop/overshoot problem—in contrast to hardware solutions such as clock stretching—are described in the form of the CRC configuration information generated by the compiler and with which control circuitry of the integrated circuit may be statically reconfigured. Embodiments of the programmatic CRC system and method have also been observed to mitigate the voltage overshoot problem since staggering startup of the compute units may also cause staggering of current ramp down of the compute units.

The CRC is described in detail below. However, first a description of embodiments of a dataflow architecture that may be embodied in an integrated circuit that may demonstrate a need for the CRC will be described along with embodiments of a compiler that generates configuration information with which the dataflow architecture may be statically reconfigured, although the various embodiments of the CRC systems and methods may be employed to solve the inductive load-induced voltage droop and/or voltage overshoot problems on other architectures embodied in an integrated circuit.

A graph is a collection of nodes connected by edges. Nodes may represent various kinds of items or operations, depending on the type of graph. Edges may represent relationships, directions, dependencies, etc. Some algorithms can be represented as computation graphs. As used herein, computation graphs are a type of directed graph comprising nodes that represent mathematical operations/ expressions and edges that indicate dependencies between the operations/expressions. For example, with machine learning (ML) algorithms, input layer nodes assign variables, output layer nodes represent algorithm outcomes, and hidden layer nodes perform operations on the variables. Edges represent data (e.g., scalars, vectors, tensors) flowing between operations. In addition to dependencies, the computation graph reveals which operations and/or expressions can be executed concurrently. A dataflow graph is a computation graph that may include one or more loops that may be nested, and wherein nodes can send messages to nodes in earlier layers to control the dataflow between the layers. A metapipeline is a subgraph of a computation graph that includes a producer operator providing its output as an input to a consumer operator to form a pipeline. A metapipeline may be nested within another metapipeline, that is, producer operators and consumer operators may include other metapipelines.

The term coarse-grained reconfigurable (CGR) refers to a property of, for example, a system, a processor, an architecture, an array, or a unit in an array. The CGR property distinguishes the system, etc., from field-programmable gate arrays (FPGAs), which can implement digital circuits at the gate level and are therefore fine-grained configurable. A CGR architecture (CGRA) is a data processor architecture that includes one or more arrays of CGR units. A CGR array is an array of CGR units, coupled with each other through an array-level network (ALN), and coupled with external elements via a top-level network (TLN). A CGR array can physically implement the nodes and edges of a dataflow graph. A CGR unit is a circuit that can be configured and reconfigured to locally store data (e.g., a memory unit or a pattern memory unit (PMU)), or to execute a programmable function (e.g., a compute unit or a pattern compute unit (PCU)). A PMU is a memory unit that can locally store data on the integrated circuit according to a programmed pattern. A PCU is a compute unit that can be configured to repetitively perform a sequence of operations. A CGR unit includes hardwired functionality that performs a limited number of functions used in computation graphs and dataflow graphs. Further examples of CGR units include an address generator (AG) and coalescing unit (CU), which may be combined in an address generator and coalescing unit (AGCU). Some implementations include CGR switches, whereas other implementations may include regular switches. A logical CGR array or logical CGR unit is a CGR array or a CGR unit that is physically realizable, but that may not have been assigned to a physical CGR array or to a physical CGR unit on an integrated circuit (IC). An integrated circuit may be monolithically integrated, i.e., a single semiconductor die that may be delivered as a bare die or as a packaged circuit. For the purposes of the present disclosure, the term integrated circuit also includes packaged circuits that include multiple semiconductor dies, stacked dies, or multiple-die substrates. A CGRA processor may also be referred to herein as a statically reconfigurable dataflow architecture processor (SRDAP).

The term "statically reconfigurable" with reference to a statically reconfigurable dataflow architecture processor (SRDAP) in the context of the present disclosure means that the configuration stores are loaded with configuration data prior to initiation of the flow of data through the vector pipeline and that the configuration stores are not loaded with new configuration data until the processed data has finished flowing through the vector pipeline, e.g., the results of the dataflow graph or section thereof have been produced. The term "statically reconfigurable" with respect to a SRDAP may be further clarified by contrast with a central processing unit (CPU) or graphics processing unit (GPU) that fetches a stream of instructions that dynamically configures the execution pipelines of the CPU/GPU as each instruction of an instruction stream is executed. For example, for each CPU/GPU instruction: the source operand address fields configure multiplexers to determine which registers of the general purpose register file provide source operands to the execution pipeline, the destination operand address field configures a de-multiplexer to determine which register of the general purpose register file receives the result of the execution pipeline, and the opcode specifies which arithmetic or logical operation functional units of the execution pipeline will perform on the source operands to generate the result. In this manner, as the CPU/GPU executes the stream of instructions, the instructions dynamically configure the CPU/GPU. In contrast, the SRDAP does not fetch instructions. As a result, the SRDAP is not dynamically configured but is instead statically reconfigured. Advantageously, the SRDAP does not incur the overhead associated with scheduling execution of instructions due to implicit dependencies of operands that are written to and read from a shared register file. Instead, the SRDAP is statically reconfigured to determine which of the pipeline registers receive the results of the functional units and which of the pipeline registers provide the results as source operands to downstream functional units. Further advantageously, the SRDAP does not incur instruction fetch overhead, e.g., from an instruction cache or system memory that a CPU/GPU incurs, which may at times result in starvation of the execution units of the CPU/GPU for instructions.

The architecture, configurability, and dataflow capabilities of an array of CGR units enable increased compute power that supports both parallel and pipelined computation. A CGR processor, which includes one or more CGR arrays, can be statically reconfigured to simultaneously execute multiple independent and interdependent dataflow graphs. To enable simultaneous execution, the dataflow graphs may need to be distilled from a high-level program and translated to a configuration file for the CGR processor. A high-level program is source code written in programming languages like Spatial, Python, C++, and C, and may use computation libraries for scientific computing, machine learning (ML), artificial intelligence (AI), and the like. The high-level program and referenced libraries can implement computing structures and algorithms of machine learning models like AlexNet, VGG Net, GoogleNet, ResNet, ResNeXt, RCNN, YOLO, SqueezeNet, SegNet, GAN, BERT, ELMo, USE, Transformer, and Transformer-XL.

A traditional compiler, e.g., for a CPU/GPU, sequentially maps, or translates, operations specified in a high-level language program to processor instructions that may be stored in an executable binary file. A traditional compiler typically performs the translation without regard to pipeline utilization and duration, tasks usually handled by the hardware. In contrast, an array of CGR units requires mapping operations to processor operations in both space (for parallelism) and time (for synchronization of interdependent computation graphs or dataflow graphs). The operation mapping requirement implies that a compiler for a CGRA must decide which operation of a computation graph or dataflow graph is statically assigned to which of the CGR units, and how both data and, related to the support of dataflow graphs, dataflow control information passes among CGR units and to and from external hosts and storage. The process of assigning logical CGR units and associated processing/operations to physical CGR units in an array and the configuration of communication paths between the physical CGR units may be referred to as "place and route" (PNR). Generally, a CGRA compiler is a translator that generates configuration data to configure a processor. A CGRA compiler may receive statements written in a programming language. The programming language may be a high-level language or a relatively low-level language. A CGRA compiler may include multiple passes, as illustrated with reference to FIG. 6. Each pass may create or update an intermediate representation (IR) of the translated statements.

FIG. 1 illustrates an example system 100 including a software stack and hardware. The software stack includes a compiler 160, a configuration file 165, and runtime processes 170. The hardware includes a CGR processor 110, a host 180, and a memory 190. CGR processor 110, also referred to as a SRDAP, has a coarse-grained reconfigurable architecture (CGRA) and includes an array of CGR units 120 such as a CGR array. CGR processor 110 further includes an IO interface 138, and a memory interface 139. Array of CGR units 120 is coupled with IO interface 138 and memory interface 139 via databus 130 which may be part of a top-level network (TLN). Host 180 communicates with IO interface 138 via system databus 185, and memory interface 139 communicates with memory 190 via memory bus 195. Array of CGR units 120 may further include compute units and memory units that are connected with an array-level network (ALN) to provide the circuitry for execution of a computation graph or a dataflow graph that may have been derived from a high-level program with user algorithms and functions. The high-level program may include a set of procedures, such as learning or inferencing in an AI or ML system. More specifically, the high-level program may include applications, graphs, application graphs, user applications, computation graphs, control flow graphs, dataflow graphs, models, deep learning applications, deep learning neural networks, programs, program images, jobs, tasks and/or any other procedures and functions that may need serial and/or parallel processing. In some implementations, execution of the graph(s) may involve using multiple units of CGR processor 110. In some implementations, CGR processor 110 may include one or more ICs. In other implementations, a single IC may span multiple CGR processors. In further implementations, CGR processor 110 may include one or more units of CGR array 120.

Host 180 may include a computer such as further described with reference to FIG. 2. Host 180 runs runtime processes, as further referenced herein, and may also be used to run computer programs, such as the compiler 160 further described herein with reference to FIG. 6. In some implementations, the compiler 160 may run on a computer that is similar to the computer described with reference to FIG. 2 but separate from host 180.

CGR processor 110 may accomplish computational tasks after being statically reconfigured by the loading of configuration data from a configuration file 165, for example, a processor-executable format (PEF) file, which is a file format suitable for configuring a SRDAP. For the purposes of the present description, a configuration file corresponds to a dataflow graph, or a translation of a dataflow graph, and may further include initialization data. The compiler 160 compiles the high-level program to provide the configuration file 165. Runtime processes 170 may install the configuration file 165 in CGR processor 110. In some implementations described herein, a CGR array is configured by programming one or more configuration stores with all or parts of the configuration file 165. A single configuration store may be at the level of the CGR processor 110 or the CGR array 120, or a CGR unit may include an individual configuration store. The configuration file may include configuration data for the CGR array 120 and CGR units in the CGR array 120 and link the computation graph to the CGR array 120. Execution of the configuration file 165 by CGR processor 110 causes the CGR array(s) 120 to implement the user algorithms and functions in the dataflow graph.

CGR processor 110 can be implemented on a single IC die or on a multichip module (MCM). An IC can be packaged in a single chip module or a multichip module. An MCM is an electronic package that may comprise multiple IC dies and other devices, assembled into a single module as if it were a single device. The various dies of an MCM may be mounted on a substrate, and the bare dies of the substrate are electrically coupled to the surface or to each other using for some examples, wire bonding, tape bonding or flip-chip bonding.

Figure 2:
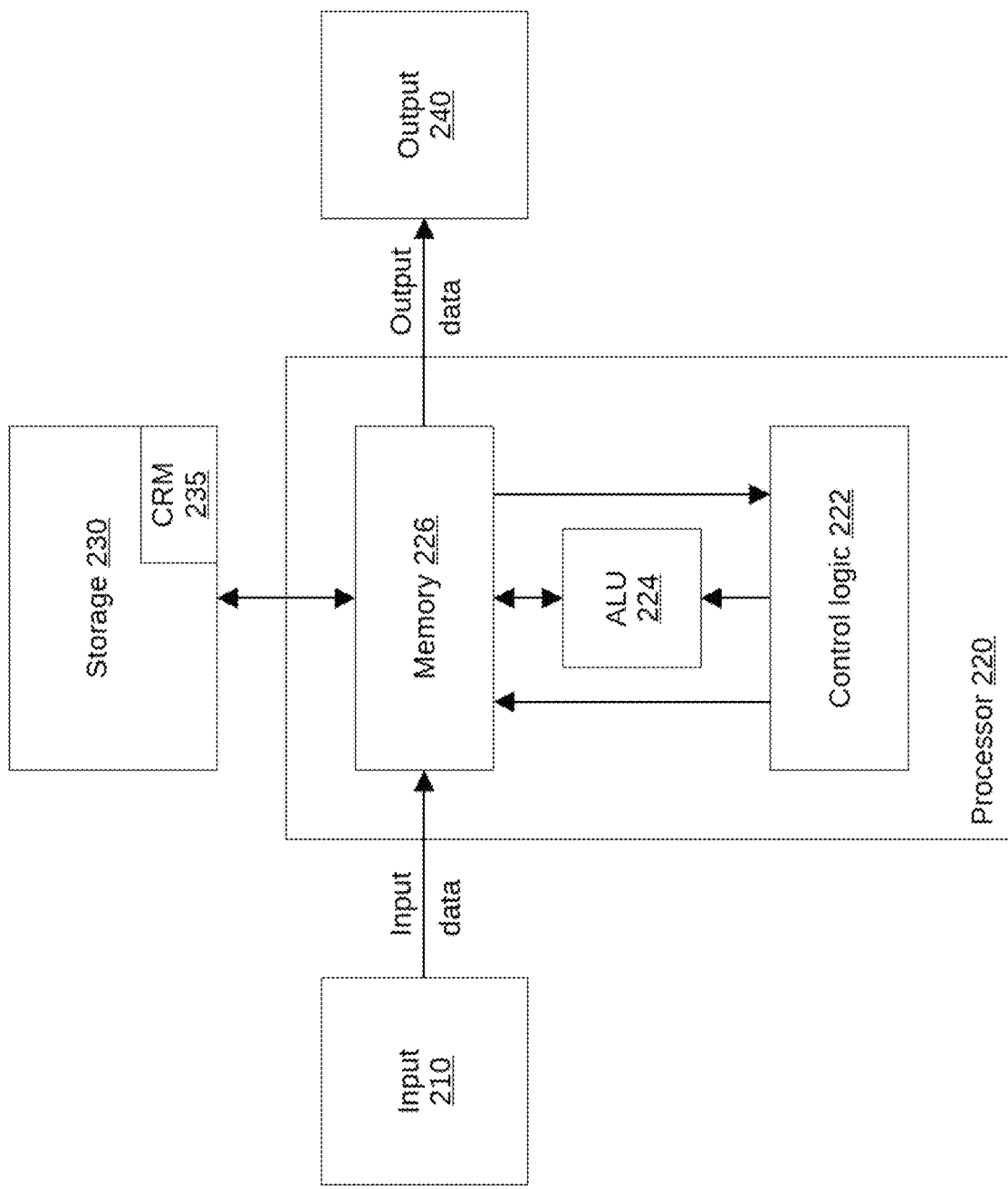
FIG. 2 illustrates an example of a computer, including an input device, a processor, a storage device, and an output device.

FIG. 2 illustrates an example of a computer 200, including an input device 210, a processor 220, a storage device 230, and an output device 240. Although the example computer 200 is drawn with a single processor, other implementations may have multiple processors. Input device 210 may comprise a mouse, a keyboard, a sensor, an input port (for example, a universal serial bus (USB) port), and other input devices. Output device 240 may comprise a monitor, printer, and any other output device known in the art. Furthermore, part or all of input device 210 and output device 240 may be combined in a network interface, such as a Peripheral Component Interconnect Express (PCIe) interface suitable for communicating with a CGR processor 110 of FIG. 1. Input device 210 is coupled with processor 220 to provide input data, which an implementation may store in memory 226. Processor 220 is coupled with output device 240 to provide output data from memory 226 to output device 240. Processor 220 further includes control logic 222, operable to control memory 226 and arithmetic and logic unit (ALU) 224, and to receive program and configuration data from memory 226. Control logic 222 further controls exchange of data between memory 226 and storage device 230. Memory 226 typically comprises memory with fast access, such as static random-access memory (SRAM), whereas storage device 230 typically comprises memory with slow access, such as dynamic random-access memory (DRAM), flash memory, magnetic disks, optical disks, and any other memory type known in the art. At least a part of the memory in storage device 230 includes a non-transitory computer-readable medium (CRM 235), such as used for storing computer programs.

Figure 3:
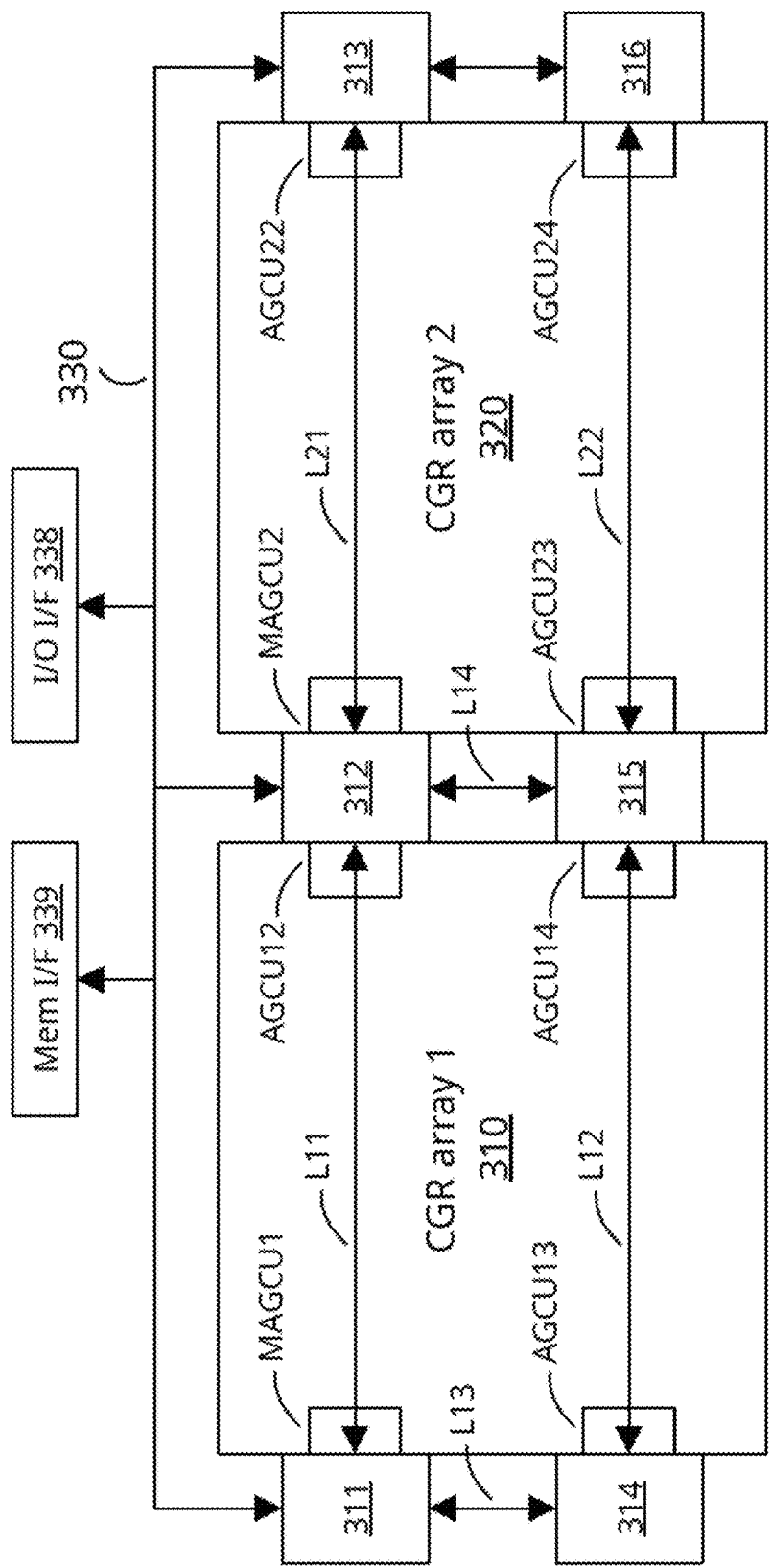
FIG. 3 illustrates example details of a coarse-grained reconfigurable architecture (CGRA) including a top-level network (TLN) and two reconfigurable dataflow units (RDUs).

FIG. 3 illustrates example details of a CGR architecture 300 including a top-level network (TLN 330) and two CGR arrays (CGR array 310 and CGR array 320). A CGR array comprises an array of CGR units coupled via an array-level network (ALN), e.g., a bus system. The CGR units may include pattern memory units (PMUs), pattern compute units (PCUs), and fused compute and memory units (FC-MUs) that include both a memory unit and a compute unit, e.g., FCMU 530 of FIG. 5. The ALN is coupled with the TLN 330 through several AGCUs, and consequently with I/O interface 338 (or any number of interfaces) and memory interface 339. Other implementations may use different bus or communication architectures.

Circuits on the TLN in the example of FIG. 3 include one or more external I/O interfaces, including I/O interface 338 and memory interface 339. The interfaces to external devices include circuits for routing data among circuits coupled with the TLN and external devices, such as high-capacity memory, host processors, other CGR processors, FPGA devices, and so on, that are coupled with the interfaces.

Each depicted CGR array has four AGCUs, e.g., MAGCU1, AGCU12, AGCU13, and AGCU14 in CGR array 310. The AGCUs interface the TLN to the ALNs and route data from the TLN to the ALN or vice versa. Other implementations may have different numbers of AGCUs.

One of the AGCUs in each CGR array in the example of FIG. 3 is configured to be a master AGCU (MAGCU), which includes an array configuration load/unload controller for the CGR array. The MAGCU1 includes a configuration load/unload controller for CGR array 310, and MAGCU2 includes a configuration load/unload controller for CGR array 320. Some implementations may include more than one array configuration load/unload controller. In other implementations, an array configuration load/unload controller may be implemented by logic distributed among more than one AGCU. In yet other implementations, a configuration load/unload controller can be designed for loading and unloading configuration of more than one CGR array. In further implementations, more than one configuration controller can be designed for configuration of a single CGR array. Also, the configuration load/unload controller can be implemented in other portions of the system, including as a stand-alone circuit on the TLN and the ALN or ALNs.

The TLN is constructed using top-level switches (switch 311, switch 312, switch 313, switch 314, switch 315, and switch 316) coupled with each other as well as with other circuits on the TLN, including the AGCUs, and external I/O interface 338. The TLN includes links (e.g., L11, L12, L21, L22) coupling the top-level switches. Data may travel in packets between the top-level switches on the links, and from the switches to the circuits on the network coupled with the switches. For example, switch 311 and switch 312 are coupled by link L11, switch 314 and switch 315 are coupled by link L12, switch 311 and switch 314 are coupled by link L13, and switch 312 and switch 313 are coupled by link L21. The links can include one or more buses and supporting control lines, including for example a chunk-wide bus (vector bus). For example, the top-level network can include data, request and response channels operable in coordination for transfer of data in any manner known in the art.

Figure 4:
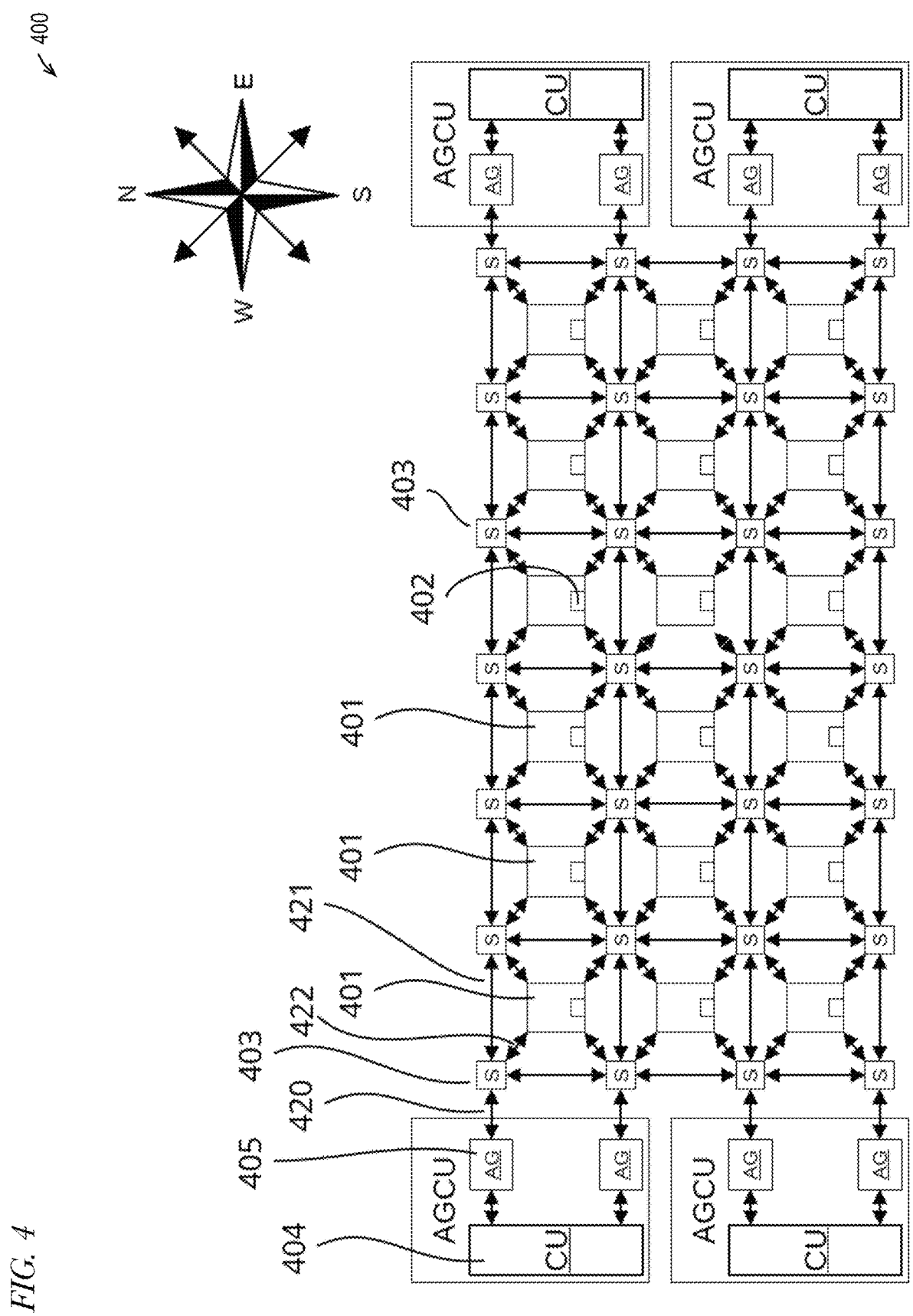
FIG. 4 illustrates an example RDU, including an array of configurable nodes in an array-level network (ALN).

FIG. 4 illustrates an example CGR array 400, including an array of CGR units in an ALN. CGR array 400 may include several types of CGR unit 401, such as FCMUs, PMUs, PCUs, memory units, and/or compute units. For examples of the functions of these types of CGR units, see Prabhakar et al., "Plasticine: A Reconfigurable Architecture for Parallel Patterns", ISCA 2017, Jun. 24-28, 2017, Toronto, ON, Canada, which is incorporated by reference for all purposes. Each of the CGR units may include a configuration store 402 comprising a set of registers or flip-flops storing configuration data, also referred to as a dataflow program, that represents the setup and/or the sequence to run the dataflow program, and that can include the number of nested loops, the limits of each loop iterator, the operations to be performed by each pipeline stage, the source of operands, and the network parameters for the input and output interfaces. A configuration file may include configuration data representing an initial configuration, or starting state, of each of the CGR units that execute a high-level program with user algorithms and functions. Program load is the process of setting up the configuration stores in the CGR array based on the configuration data to allow the CGR units to execute the high-level program. Program load may also require loading memory units and/or PMUs. In some implementations, each CGR unit 401 comprises an FCMU. In other implementations, the array comprises both PMUs and PCUs, or memory units and compute units, arranged in a checkerboard pattern. In yet other implementations, CGR units may be arranged in different patterns. The ALN includes switch units 403 (S), and AGCUs (each including two address generators 405 (AG) and a shared coalescing unit 404 (CU)). Switch units 403 are connected among themselves via interconnects 421 and to a CGR unit 401 with interconnects 422. Switch units 403 may be coupled with address generators 405 via interconnects 420. In some implementations, communication channels can be configured as end-to-end connections, and switch units 403 are CGR units. In other implementations, switches route data via the available links based on address information in packet headers, and communication channels established as and when needed.

Figure 5:
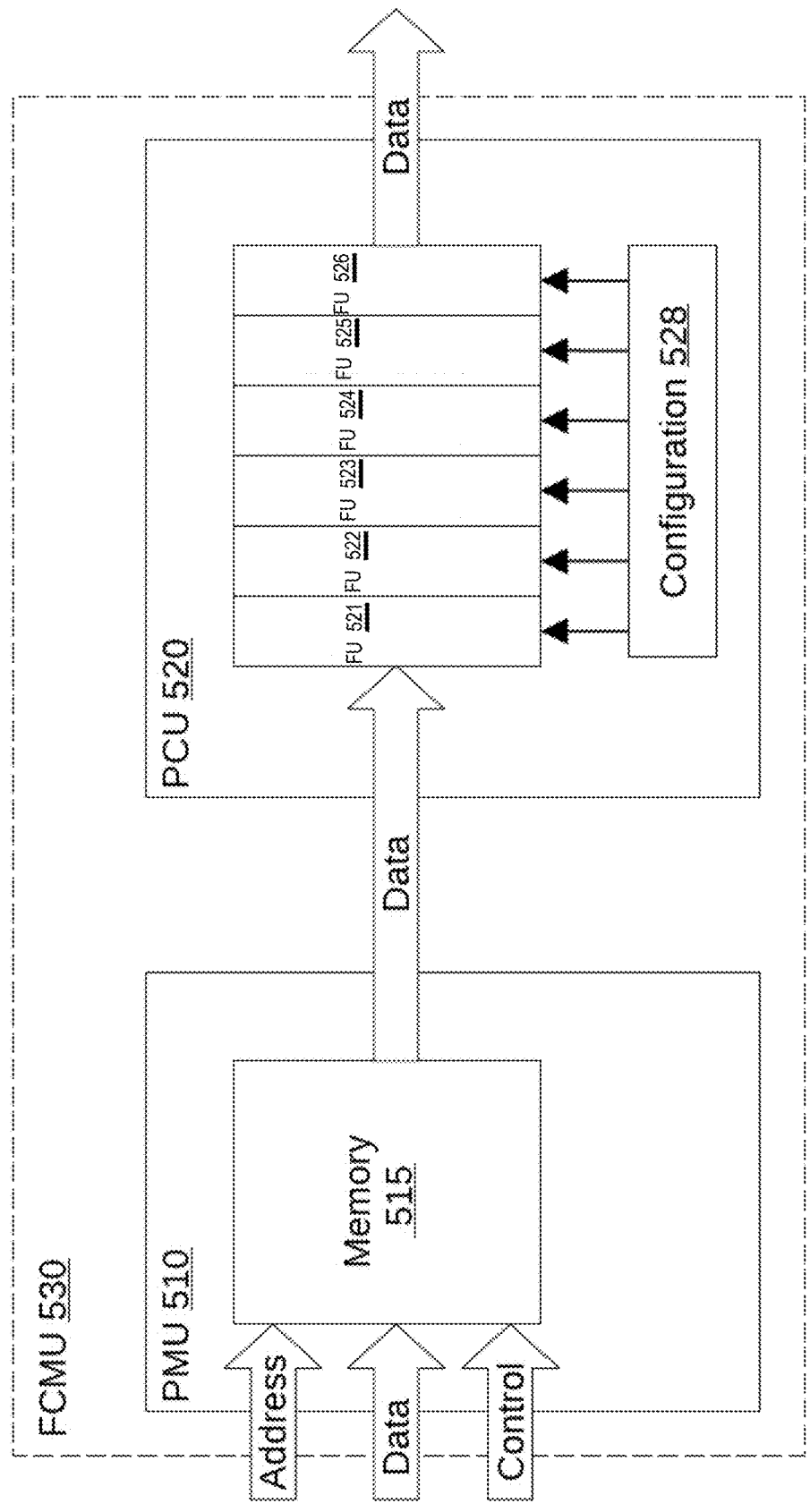
FIG. 5 illustrates an example of a pattern memory unit (PMU) and a pattern compute unit (PCU), which may be combined in a fused-control memory unit (FCMU).

The ALN includes one or more kinds of physical data buses, for example a chunk-level vector bus (e.g., 512 bits of data), a word-level scalar bus (e.g., 32 bits of data), and a control bus, e.g., as shown in FIG. 5. For instance, interconnects 421 between two switches may include a vector bus interconnect with a bus width of 512 bits, a scalar bus interconnect with a bus width of 32 bits, and a control bus. A control bus can comprise a configurable interconnect that carries multiple control bits on signal routes. The signal routes may be statically reconfigured by configuration data in the configuration file. The control bus can comprise physical lines separate from the data buses in some implementations. In other implementations, the control bus can be implemented using the same physical lines with a separate protocol or in a time-sharing procedure.

Physical data buses may differ in the granularity of data being transferred. In one implementation, a vector bus can carry a chunk that includes 16 channels of 32-bit floating-point data or 32 channels of 16-bit floating-point data (i.e., 512 bits) of data as its payload. A scalar bus can have a 32-bit payload and carry scalar operands or control information. The control bus can carry control handshakes such as tokens and other signals. The vector and scalar buses can be packet-switched, including headers that indicate a destination of each packet and other information such as sequence numbers that can be used to reassemble a file when the packets are received out of order. Each packet header can contain a destination identifier that identifies the geographical coordinates of the destination switch unit (e.g., the row and column in the array), and an interface identifier that identifies the interface on the destination switch (e.g., North, South, East, West, etc.) used to reach the destination unit.

A CGR unit 401 may have four ports (as drawn) to interface with switch units 403, or any other number of ports suitable for an ALN. Each port may be suitable for receiving and transmitting data, or a port may be suitable for only receiving or only transmitting data.

A switch unit, as shown in the example of FIG. 4, may have eight interfaces. The North, South, East and West interfaces of a switch unit may be used for links between switch units using interconnects 421. The Northeast, Southeast, Northwest and Southwest interfaces of a switch unit may each be used to make a link with an FCMU, PCU or PMU instance using one of the interconnects 422. Two switch units in each CGR array quadrant have links to an AGCU using interconnects 420. The AGCU coalescing unit arbitrates between the AGs and processes memory requests. Each of the eight interfaces of a switch unit can include a vector interface, a scalar interface, and a control interface to communicate with the vector network, the scalar network, and the control network. In other implementations, a switch unit may have any number of interfaces.

During execution of a graph or subgraph in a CGR array after configuration, data can be sent via one or more switch units and one or more links between the switch units to the CGR units using the vector bus and vector interface(s) of the one or more switch units on the ALN. A CGR array may comprise at least a part of CGR array 400, and any number of other CGR arrays coupled with CGR array 400.

A data processing operation implemented by CGR array configuration may comprise multiple graphs or subgraphs specifying data processing operations that are distributed among and executed by corresponding CGR units (e.g., FCMUs, PMUs, PCUs, AGs, and CUs).

FIG. 5 illustrates an example 500 of a PMU 510 and a PCU 520, which may be combined in an FCMU 530. PMU 510 may be directly coupled to PCU 520, or optionally via one or more switches. PMU 510 includes a scratchpad memory 515, which may receive external data, memory addresses, and memory control information (write enable, read enable) via one or more buses included in the ALN. PCU 520 includes two or more processor stages, e.g., functional units (FUs) 521 through 526, and configuration store 528. The processor stages may include ALUs or other reconfigurable stages that can process data.

Each stage in PCU 520 may also hold one or more registers (e.g., PRs 1002 of FIG. 10) for short-term storage of operands. Short-term storage, for example during one to several clock cycles or unit delays, allows for synchronization of data in the PCU pipeline.

Figure 6:
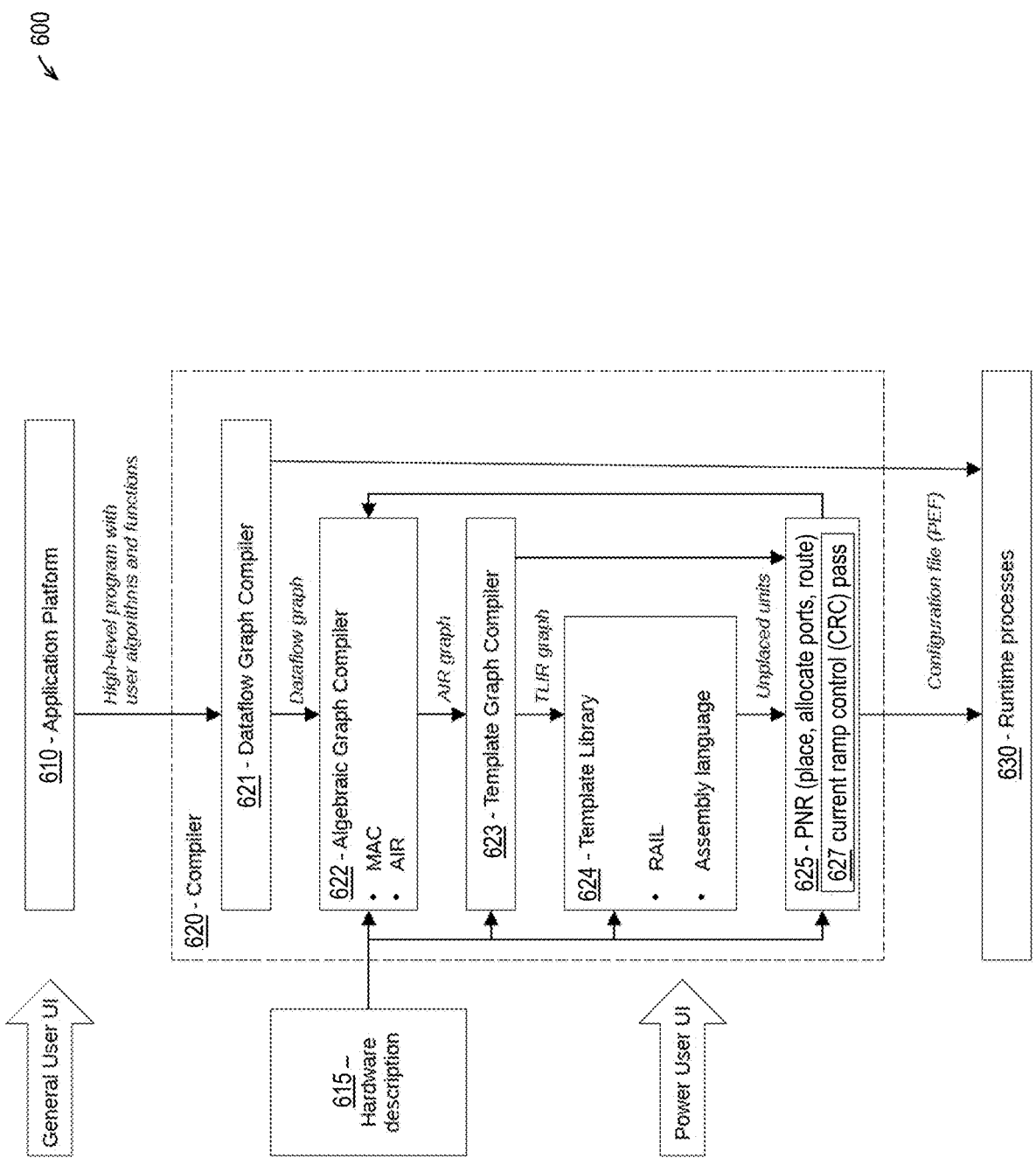
FIG. 6 is a block diagram of a compiler stack implementation suitable for generating a configuration file for a coarsely reconfigurable data processor or a CGRA processor.

FIG. 6 is a block diagram of a compiler stack 600 implementation suitable for generating a configuration file for a CGR processor. FIGS. 7-11 illustrate various representations of an example user program 700 corresponding to various phases of a compiler stack such as compiler stack 600. As depicted, compiler stack 600 includes several phases to convert a high-level program (e.g., user program 700) with statements 710 that define user algorithms and functions, e.g., algebraic expressions and functions, to configuration data for the CGR units. The example user program 700 depicted in FIG. 7 comprises statements 710 that invoke various PyTorch functions.

Compiler stack 600 may take its input from application platform 610, or any other source of high-level program statements suitable for parallel processing, which provides a user interface for general users. It may further receive hardware description 615, for example defining the physical units in a reconfigurable data processor or CGRA processor. Application platform 610 may include libraries such as PyTorch, TensorFlow, ONNX, Caffe, and Keras to provide user-selected and configured algorithms.

Application platform 610 outputs a high-level program to compiler 620, which in turn outputs a configuration file to the reconfigurable data processor or CGRA processor where it is executed in runtime processes 630. Compiler 620 may include dataflow graph compiler 621, which may handle a dataflow graph, algebraic graph compiler 622, template graph compiler 623, template library 624, and placer and router PNR 625. The PNR 625 includes a current ramp control (CRC) pass 627 which, as described in more detail below, generates configuration information that is loaded into the CGRA processor and used to enforce the CRC paradigm, e.g., based on dataflow graph analysis, to provide programmatic solutions to the voltage droop/overshoot problem that may otherwise be experienced by the CGRA processor drawing current at a steep time rate of change through inductive loads. In some implementations, template library 624 includes RDU abstract intermediate language (RAIL) and/or assembly language interfaces for power users.

Dataflow graph compiler 621 converts the high-level program with user algorithms and functions from application platform 610 to one or more dataflow graphs. The high-level program may be suitable for parallel processing, and therefore parts of the nodes of the dataflow graphs may be intrinsically parallel unless an edge in the graph indicates a dependency. Dataflow graph compiler 621 may provide code optimization steps like false data dependency elimination, dead-code elimination, and constant folding. The dataflow graphs encode the data and control dependencies of the high-level program. Dataflow graph compiler 621 may support programming a reconfigurable data processor at higher or lower-level programming languages, for example from an application platform 610 to C++ and assembly language. In some implementations, dataflow graph compiler 621 allows programmers to provide code that runs directly on the reconfigurable data processor. In other implementations, dataflow graph compiler 621 provides one or more libraries that include predefined functions like linear algebra operations, element-wise tensor operations, non-linearities, and reductions required for creating, executing, and profiling the dataflow graphs on the reconfigurable processors. Dataflow graph compiler 621 may provide an application programming interface (API) to enhance functionality available via the application platform 610.

Figure 7:
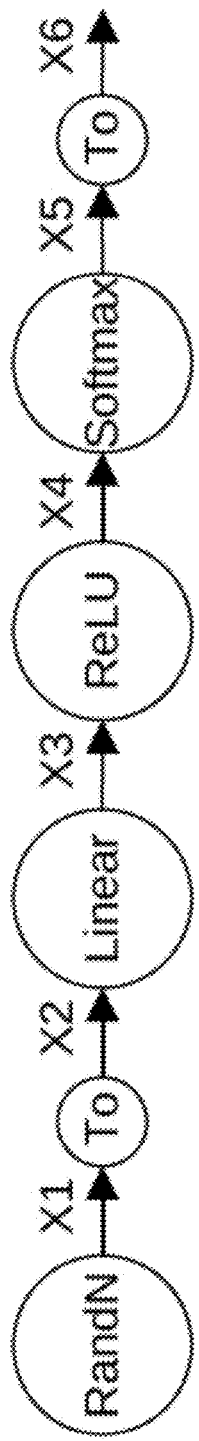
FIG. 7 shows an example user program in an example first phase of the compiler stack.

FIG. 7 shows an example user program 700 in an example first phase of the compiler stack. User program 700 generates a random tensor X1 with a normal distribution in the RandN node. It provides the tensor to a neural network cell that performs a weighing function (in the Linear node) followed by a rectified linear unit (ReLU) activation function, which is followed by a Softmax activation function, for example to normalize the output to a probability distribution over a predicted output class. FIG. 7 does not show the weights and bias used for the weighing function. User program 700 corresponds with computation graph 750.

Algebraic graph compiler 622 may include a model analyzer and compiler (MAC) level that makes high-level mapping decisions for (sub-graphs of the) dataflow graph based on hardware constraints. It may support various application frontends such as Samba, JAX, and TensorFlow/

HLO. Algebraic graph compiler 622 may also transform the graphs via autodiff and GradNorm, perform stitching between sub-graphs, interface with template generators for performance and latency estimation, convert dataflow graph operations to AIR operation, perform tiling, sharding (database partitioning) and other operations, and model or estimate the parallelism that can be achieved on the dataflow graphs.

Algebraic graph compiler 622 may further include an arithmetic or algebraic intermediate representation (AIR) level that translates high-level graph and mapping decisions provided by the MAC level into explicit AIR/Tensor statements 800 (see FIG. 8) and one or more corresponding algebraic graphs 850. Key responsibilities of the AIR level include legalizing the graph and mapping decisions of the MAC, expanding data parallel, tiling, metapipe, region instructions provided by the MAC, inserting stage buffers and skip buffers, eliminating redundant operations, buffers, and sections, and optimizing for resource use, latency, and throughput.

Figure 8:
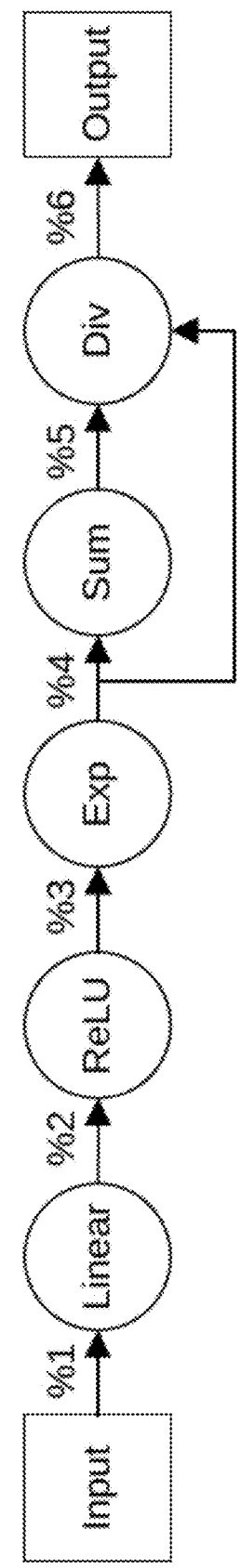
FIG. 8 shows the user program in an example second phase of the compiler stack.

FIG. 8 shows the user program 700 in an example second phase of the compiler stack. At this phase, the algebraic graph compiler replaces the Softmax macro by its constituents. The Softmax function is given as $$\frac{e^{\{z_i\}}}{\sum_{j=1}^{K} e^{\{z_j\}}}.$$

This function includes an exponential component, a summation, and a division. Thus, algebraic graph compiler 622 replaces the user program statements 710, also shown as computation graph 750, by AIR/Tensor statements 800, also shown as AIR/Tensor computation graph 850.

Figure 9B:
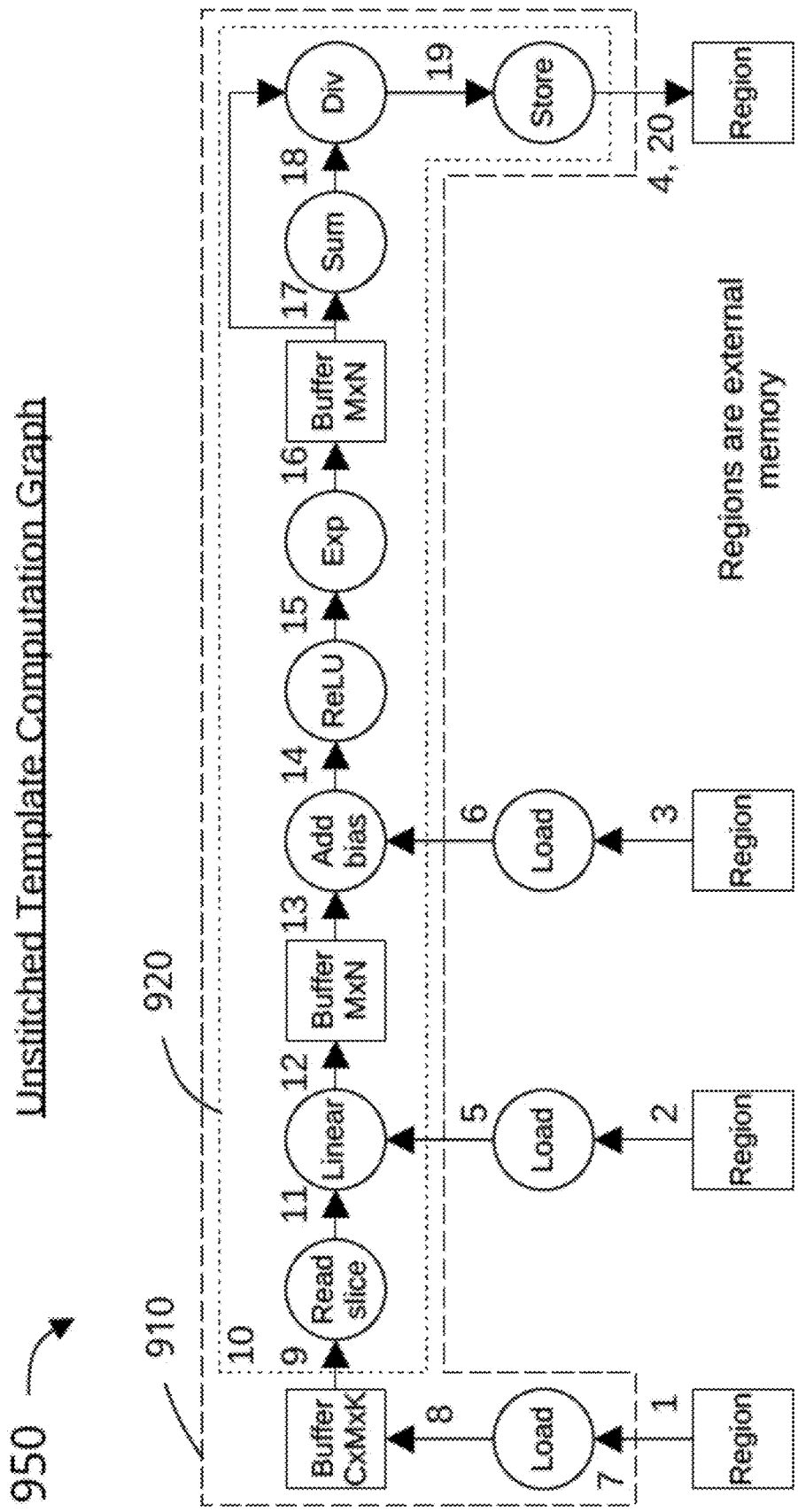

Template graph compiler 623 may translate AIR statements and/or graphs into TLIR statements 900 (see FIG. 9A) and/or graphs (graph 950 is shown in FIG. 9B), optimizing for the target hardware architecture into unplaced variable-sized units (referred to as logical CGR units) suitable for PNR 625. Template graph compiler 623 may allocate metapipelines, such as metapipeline 910 and metapipeline 920, for sections of the template dataflow statements 900 and corresponding sections of unstitched template computation graph 950. Template graph compiler 623 may add further information (name, inputs, input names and dataflow description) for PNR 625 and make the graph physically realizable through each performed step. Template graph compiler 623 may for example provide translation of AIR graphs to specific model operation templates such as for general matrix multiplication (GeMM). An implementation may convert part or all intermediate representation operations to templates, stitch templates into the dataflow and control flow, insert necessary buffers and layout transforms, generate test data and optimize for hardware use, latency, and throughput.

Implementations may use templates for common operations. Templates may be implemented using assembly language, RAIL, or similar. RAIL is comparable to assembly language in that memory units and compute units are separately programmed, but it can provide a higher level of abstraction and compiler intelligence via a concise performance-oriented domain-specific language for CGR array templates. RAIL enables template writers and external power users to control interactions between logical compute units and memory units with high-level expressions without the need to manually program capacity splitting, register allocation, etc. The logical compute units and memory units also enable stage/register allocation, context splitting, transpose slotting, resource virtualization and mapping to multiple physical compute units and memory units (e.g., PCUs and PMUs).

Template library 624 may include an assembler that provides an architecture-independent low-level programming interface as well as optimization and code generation for the target hardware. Responsibilities of the assembler may include address expression compilation, intra-unit resource allocation and management, making a template graph physically realizable with target-specific rules, low-level architecture-specific transformations and optimizations, and architecture-specific code generation.

Figure 10:
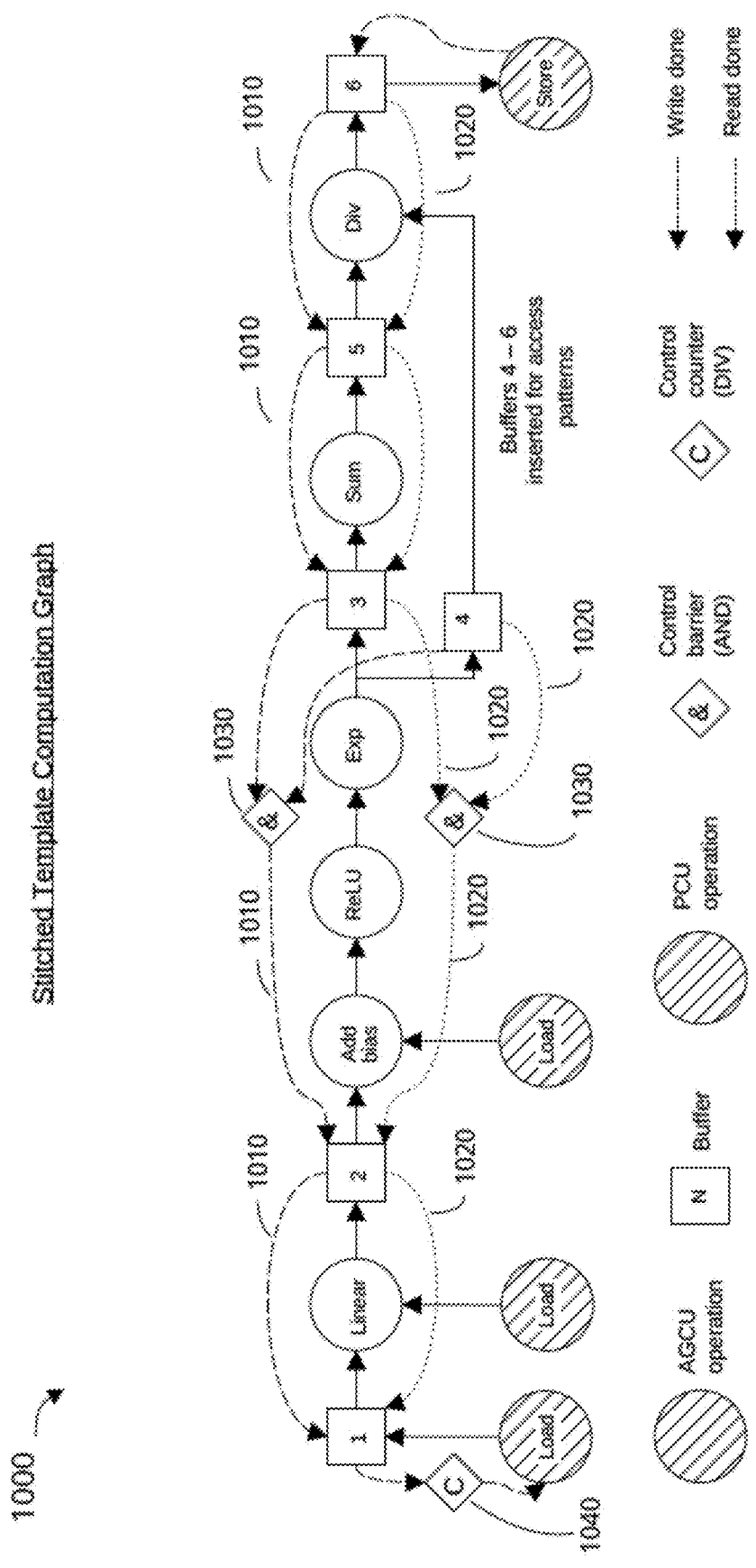
FIG. 10 shows the user program in an example fourth phase of the compiler stack.

FIG. 10 shows the user program 700 in an example fourth phase of the compiler stack. The template graph compiler 623 may also determine the control signals 1010 and 1020, as well as control gates 1030 and 1040 required to enable the CGR units (whether logical or physical) to coordinate dataflow between the CGR units in the CGR array of a CGR processor. This process, sometimes referred to as stitching, produces a stitched template compute graph 1000 with control signals 1010-1020 and control gates 1030-1040. In the example depicted in FIG. 10, the control signals include write done signals 1010 and read done signals 1020, and the control gates include 'AND' gates 1030 and a counting or 'DIV' gate 1040. The control signals and control gates enable coordinated dataflow between the configurable units of CGR processors such as compute units, memory units, and AGCUs.

Figure 11:
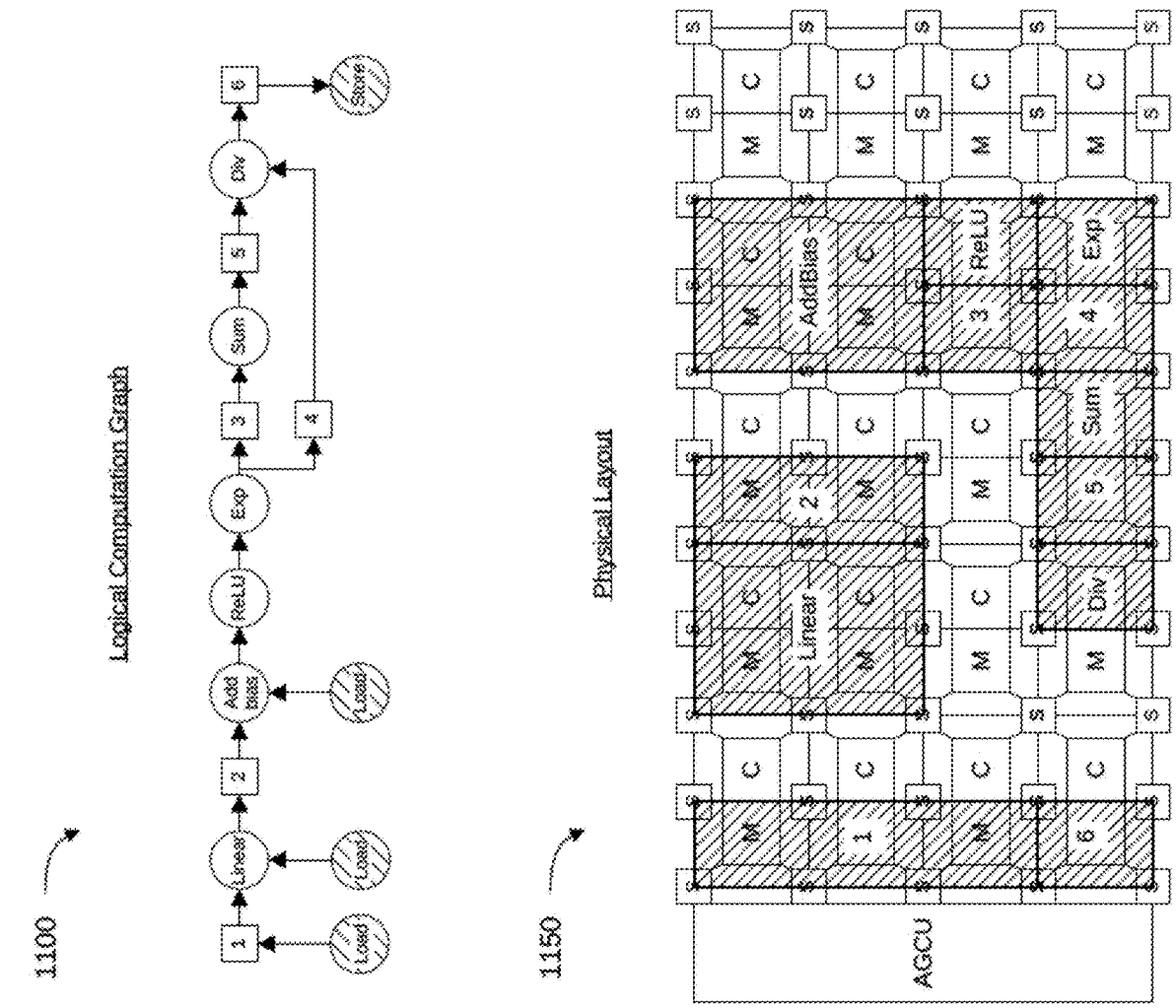
FIG. 11 shows the logical computation graph and an example physical layout of the user program.

PNR 625 translates and maps logical (i.e., unplaced physically realizable) CGR units (e.g., the nodes of the logical computation graph 1100 shown in FIG. 11) to a physical layout (e.g., the physical layout 1150 shown in FIG. 11) on the physical level, e.g., a physical array of CGR units in a semiconductor chip. PNR625 also determines physical data channels to enable communication among the CGR units and between the CGR units and circuits coupled via the TLN; allocates ports on the CGR units and switches; provides configuration data and initialization data for the target hardware; and produces configuration files, e.g., processor-executable format (PEF) files. It may further provide bandwidth calculations, allocate network interfaces such as AGCUs and virtual address generators (VAGs), provide configuration data that allows AGCUs and/or VAGs to perform address translation, and control ALN switches and data routing. PNR 625 may provide its functionality in multiple steps and may include multiple modules (not shown in FIG. 6) to provide the multiple steps, e.g., a placer, a router, a port allocator, a PEF file generator, and CRC pass 627. PNR 625 may receive its input data in various ways. For example, it may receive parts of its input data from any of the earlier modules (dataflow graph compiler 621, algebraic graph compiler 622, template graph compiler 623, and/or template library 624). In some implementations, an earlier module, such as template graph compiler 623, may have the task of preparing all information for PNR 625 and no other units provide PNR input data directly.

Further implementations of compiler 620 provide for an iterative process, for example by feeding information from PNR 625 back to an earlier module, so that the earlier module can execute a new compilation step in which it uses physically realized results rather than estimates of or placeholders for physically realizable circuits. For example, PNR 625 may feed information regarding the physically realized circuits back to algebraic graph compiler 622.

Memory allocations represent the creation of logical memory spaces in on-chip and/or off-chip memories for data required to implement the dataflow graph, and these memory allocations are specified in the configuration file. Memory allocations define the type and the number of hardware circuits (functional units, storage, or connectivity components). Main memory (e.g., DRAM) may be off-chip memory, and scratchpad memory (e.g., SRAM) is on-chip memory inside a CGR array. Other memory types for which the memory allocations can be made for various access patterns and layouts include cache, read-only look-up tables (LUTs), serial memories (e.g., FIFOs), and register files.

Compiler 620 binds memory allocations to unplaced memory units and binds operations specified by operation nodes in the dataflow graph to unplaced compute units, and these bindings may be specified in the configuration data. In some implementations, compiler 620 partitions parts of a dataflow graph into memory subgraphs and compute subgraphs and specifies these subgraphs in the PEF file. A memory subgraph may comprise address calculations leading up to a memory access. A compute subgraph may comprise all other operations in the parent graph. In one implementation, a parent graph is broken up into multiple memory subgraphs and exactly one compute subgraph. A single parent graph can produce one or more memory subgraphs, depending on how many memory accesses exist in the original loop body. In cases where the same memory addressing logic is shared across multiple memory accesses, address calculation may be duplicated to create multiple memory subgraphs from the same parent graph.

Compiler 620 generates the configuration files with configuration data (e.g., a bit stream) for the placed positions and the routed data and control networks. In one implementation, this includes assigning coordinates and communication resources of the physical CGR units by placing and routing unplaced units onto the array of CGR units while maximizing bandwidth and minimizing latency.

FIG. 11 shows the logical computation graph 1100 and an example physical layout 1150 of the user program.

A first example of accelerated deep learning is using a deep learning accelerator implemented in a CGRA processor to train a neural network. A second example of accelerated deep learning is using the deep learning accelerator to operate a trained neural network to perform inferences. A third example of accelerated deep learning is using the deep learning accelerator to train a neural network and subsequently perform inference with any one or more of the trained neural networks, information from the trained neural network, and a variant of the same.

Examples of neural networks include fully connected neural networks (FCNNs), recurrent neural networks (RNNs), graph neural networks (GNNs), convolutional neural networks (CNNs), graph convolutional networks (GCNs), long short-term memory (LSTM) networks, autoencoders, deep belief networks, and generative adversarial networks (GANs).

An example of training a neural network is determining one or more weights associated with the neural network, such as by back-propagation in a deep learning accelerator. An example of making an inference is using a trained neural network to compute results by processing input data using the weights associated with the trained neural network. As used herein, the term 'weight' is an example of a 'parameter' as used in various forms of neural network processing. For example, some neural network learning is directed to determining parameters (e.g., through back-propagation) that are usable for performing neural network inferences.

A neural network processes data according to a dataflow graph comprising layers of neurons. Example layers of neurons include input layers, hidden layers, and output layers. Stimuli (e.g., input data) are received by an input layer of neurons and the computed results of the dataflow graph (e.g., output data) are provided by an output layer of neurons. Example hidden layers include rectified linear unit (ReLU) layers, fully connected layers, recurrent layers, graphical network layers, long short-term memory layers, convolutional layers, kernel layers, dropout layers, and pooling layers. A neural network may be conditionally and/or selectively trained. After being trained, a neural network may be conditionally and/or selectively used for inference.

Examples of ICs, or parts of ICs, that may be used as deep learning accelerators, are processors such as central processing unit (CPUs), CGR processor ICs, graphics processing units (GPUs), FPGAs, ASICs, application-specific instruction-set processor (ASIP), and digital signal processors (DSPs). The disclosed technology implements efficient distributed computing by allowing an array of accelerators (e.g., reconfigurable processors) attached to separate hosts to directly communicate with each other via buffers.

Figure 12:
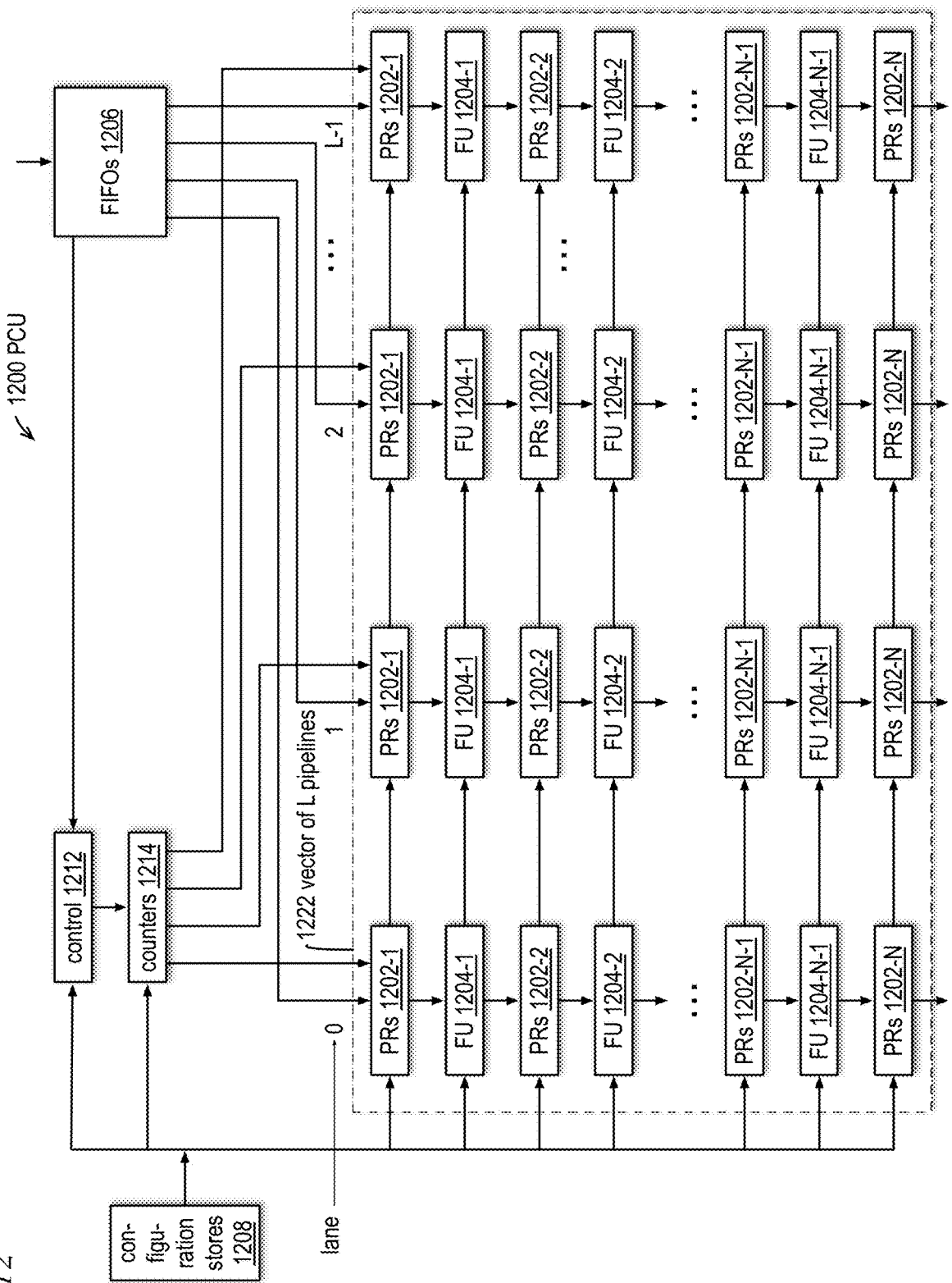
FIG. 12 is an example block diagram illustrating a pattern compute unit (PCU) of a statically reconfigurable dataflow architecture processor (SRDAP).

FIG. 12 is an example block diagram illustrating a pattern compute unit (PCU) 1200 of a statically reconfigurable dataflow architecture processor (SRDAP) in accordance with embodiments of the present disclosure. The SRDAP may also be referred to as a CGR array (e.g., CGR array 400 of FIG. 4) that embodies a CGR architecture (e.g., CGR architecture 300 of FIG. 3) or a CGR processor (e.g., CGR processor 110 of FIG. 1), as described above. The PCU 1200 (e.g., PCU CGR unit 401 of FIG. 4 or PCU 520 of FIG. 5) includes configuration stores 1208, a control block 1212, counters 1214, FIFOs 1206, and a vector pipeline 1222 of functional units (FUs) 1204 interleaved with pipeline registers (PRs) 1202.

The configuration stores 1208 (e.g., configuration stores 402 of FIG. 4 or configuration stores 528 of FIG. 5) are loaded with configuration data that is used to statically reconfigure the PCU 1200. More specifically, the configuration stores 1208 provide relevant portions of the configuration data to the control block 1212, the counters 1214, the PRs 1202, and the FUs 1204. The configuration data provided to a counter 1214 may include an initial value, a stride value, and a terminal value. The stride value is the amount by which the counter counts. The terminal values specifies when the counter 1214 stops counting, e.g., the maximum value in the case that the counter 1214 is statically reconfigured to count up. The configuration data provided to a control block 1212 may include FIFO-related information and state machine-related information that is used to control when data is allowed to flow through the PCU 1200, as described below. The configuration data provided to the FUs 1204 may include signals that control which operation is performed by each of the FUs 1204, e.g., MACC, multiply, add, subtract, divide, rotate, shift, Boolean AND, OR, XOR, NOT, etc. The configuration data provided to the PRs 1202 may include control signals to multiplexers (or muxes) and demultiplexers (or demuxes).

The FIFOs 1206 provide data to the vector pipeline 1222. In an embodiment, the FIFOs 1206 include vector FIFOs 1206 that receive and provide vector data, as well as scalar FIFOs 1206 that receive and provide scalar data. The FIFOs 1206 may receive data from other array elements, i.e., other PCUs 1200, PMUs 1300 (e.g., 510 of FIG. 5), and/or switches (e.g., S 403 of FIG. 4) that interconnect the PCUs 1200 and PMUs 1300. The FIFOs 1206 may provide control signals to the control block 1212, e.g., to indicate whether a FIFO 1206 is non-empty. The control block 1212 may also receive control signals (e.g., via switches 403) from FIFOs 1206 of other array elements, e.g., to indicate whether a FIFO is full. A control block 1212 is not enabled until all FIFOs the PCU 1200 reads from are not empty and all FIFOs the PCU 1200 writes to are not full. The FIFO full and not empty signals may be routed from a consumer PCU 1200, PMU 1300, or switch 403 to a producer PCU 1200, PMU 1300, or switch 403 through the control network formed by the switches 403.

The vector pipeline 1222 includes L lanes, or individual pipelines, of FUs 1204 interleaved with PRs 1202. The L lanes are denoted 0 through L−1. The PRs 1202 provide source operands to the FUs 1204. The PRs 1202 also receive results, or destination operands, from the FUs 1204. The PRs 1202 include muxes (not shown) and demuxes (not shown). The muxes are statically reconfigured by the configuration data to specify which PRs 1202 provide source operands to each FU 1204. The demuxes are statically reconfigured by the configuration data to specify which PRs 1202 receive results from each FU 1204.

The ALN switches 403 and AGCUs (e.g., of FIG. 4) may also include configuration stores, FIFOs, control blocks, and counters similar to those of the PCUs 1200 and PMUs 1300. The switches 403 and AGCUs may be in communication with the counters and control blocks of the PCUs 1200 and PMUs 1300 via control buses of the control network of the array-level network (ALN) to exchange dataflow control information as described above. In an embodiment, counters in the switches, PMUs, and/or AGCUs may operate to perform current ramp control to mitigate inductive-induced voltage droop and/or overshoot.

In summary, a PCU comprises a vector pipeline of functional units statically reconfigurable to perform one or more of a set of arithmetic and logical operations on operands received from a previous pipeline stage of the PCU, from another PCU, and/or from one or more of the PMUs. The configuration data loaded into the configuration stores determines which arithmetic and logical operations are performed by the functional units. Additionally, the configuration data may control multiplexers and demultiplexers to specify which of the pipeline registers provide source operands to the functional units and which pipeline registers of the vector pipeline receive results produced by the functional units. Additionally, the configuration data determine initial values, stride values, and terminal values of counters of the PCUs. The counters may be employed as loop iterators, and the counter values may be included in the data that flows through the vector pipeline. The counters may be chained together to accomplish loop nesting. The counters and control block may be statically reconfigured with configuration data generated by the compiler (e.g., compiler 620 of FIG. 6) and thus reconfigured may operate to perform current ramp control to mitigate inductive-induced voltage droop and/or overshoot, embodiments of which is described herein.

Figure 13:
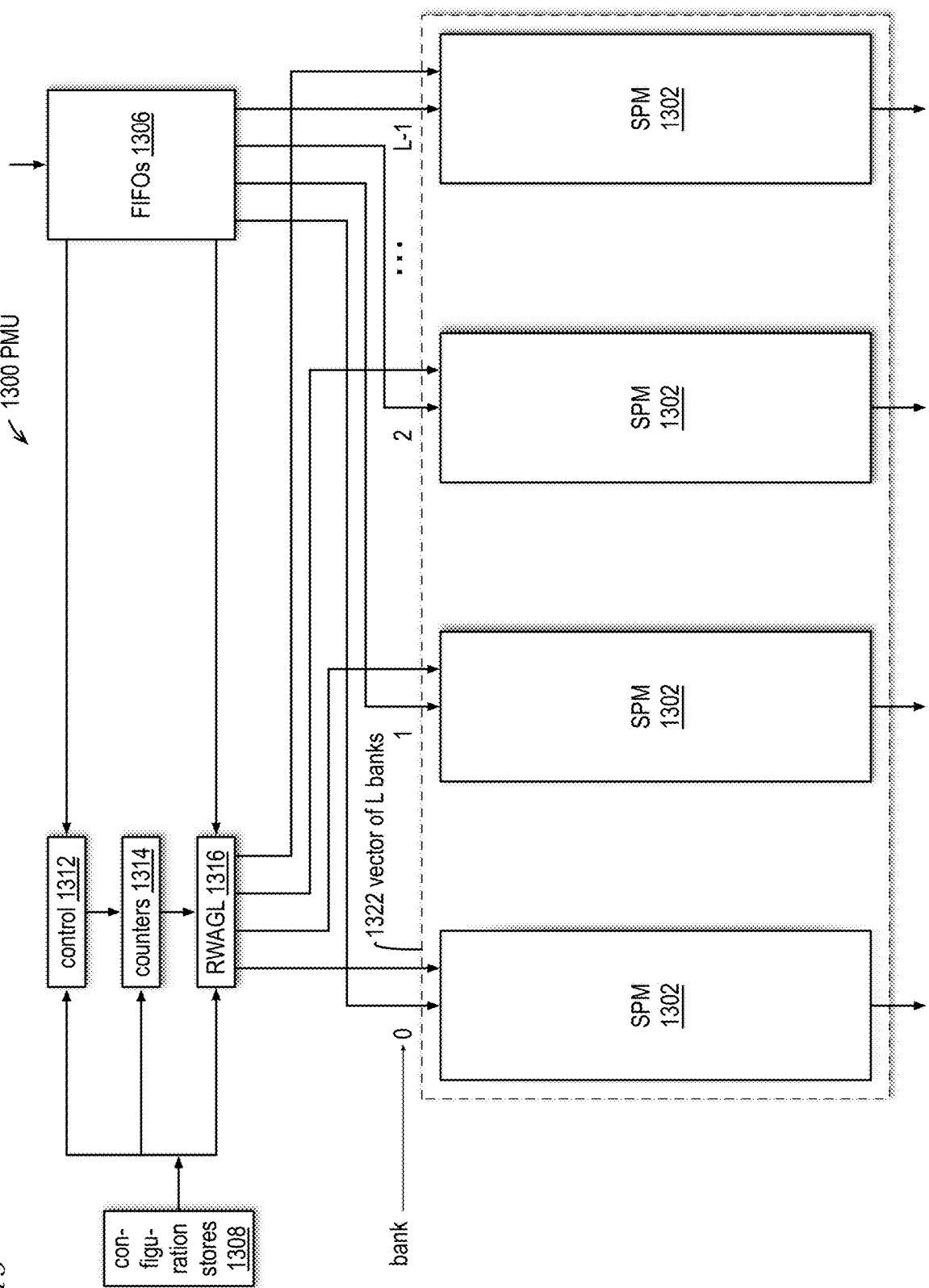
FIG. 13 is an example block diagram illustrating a pattern memory unit (PMU) of a SRDAP.

FIG. 13 is an example block diagram illustrating a pattern memory unit (PMU) 1300 of a SRDAP in accordance with embodiments of the present disclosure. The PMU 1300 (e.g., PMU CGR unit 401 of FIG. 4 or PMU 510 of FIG. 5) includes configuration stores 1308, a control block 1312, counters 1314, and FIFOs 1306 similar to the corresponding elements of the PCU 1200 of FIG. 12. The PMU 1300 also includes scratchpad memories (SPMs) 1302 arranged as a vector of banks 1322, shown as L banks, denoted 0 through L−1, that correspond to the L lanes of a PCU 1200. The SPMs 1302 may be written with data (e.g., pixel values, pixel addresses) received from PCUs 1200, other PMUs 1300, and switches 403 via the FIFOs 1306, and the data in the SPMs 1302 may be read by PCUs 1200, other PMUs 1300, and switches 403. The SPMs 1302 may be pre-loaded with data, e.g., from host memory 190, and then read by PCUs 1200 to perform operations on the data. Also, the SPMs 1302 may be written with the results of the operations by the PCUs 1200, which may be subsequently stored from the SPM 1302 to a memory outside the SRDAP, e.g., to the host memory 190. The PMUs 1300 may facilitate high throughput of dataflow through the SRDAP due to their bank arrangement that matches the lane arrangement of the PCUs 1200 and due to their large size and speed. In an embodiment, each bank is four bytes wide, i.e., each location in an SPM 1302 holds a 4-byte word, although other embodiments are contemplated.

The PMU 1300 also includes read and write address generation logic (RWAGL) 1316 that is statically reconfigured by configuration data from the configuration stores 1308 and that may receive address generation information from the FIFOs 1306. The RWAGL 1316 generates read addresses and write addresses that are provided to each of the SPM 1302 to respectively read and write each of the SPM 1302. The read addresses and write addresses may be generated concurrently by the RWAGL 1316 to facilitate writing to and reading from the SPMs 1302 in a streaming fashion, i.e., the SPMs 1302 may be concurrently written and read, to facilitate high throughput during data processing. The RWAGL 1316 may be statically reconfigured to generate addresses in multiple modes.

In summary, a PMU comprises a vector of scratchpad memory banks writable and readable by a PCU and/or one or more other PMUs. The configuration data loaded into the configuration stores determines in which of multiple access modes the address generation logic is statically reconfigured to access the vector of banks. Additionally, the configuration data may determine initial values, stride values, and terminal values of counters of the PMUs which may provide counts to the address generation logic. The counters may be employed as loop iterators. The counters may be chained together to accomplish loop nesting. The PMU includes a statically reconfigurable scalar addressing datapath to compute flattened addresses from the counters. The PMU may also receive a vector of addresses (e.g., computed by a PCU). The counters and control block of the PMU may be statically reconfigured with configuration data generated by the compiler (e.g., compiler 620 of FIG. 6) and thus reconfigured may operate to perform current ramp control to mitigate inductive-induced voltage droop and/or overshoot, embodiments of which is described herein.

Figure 14:
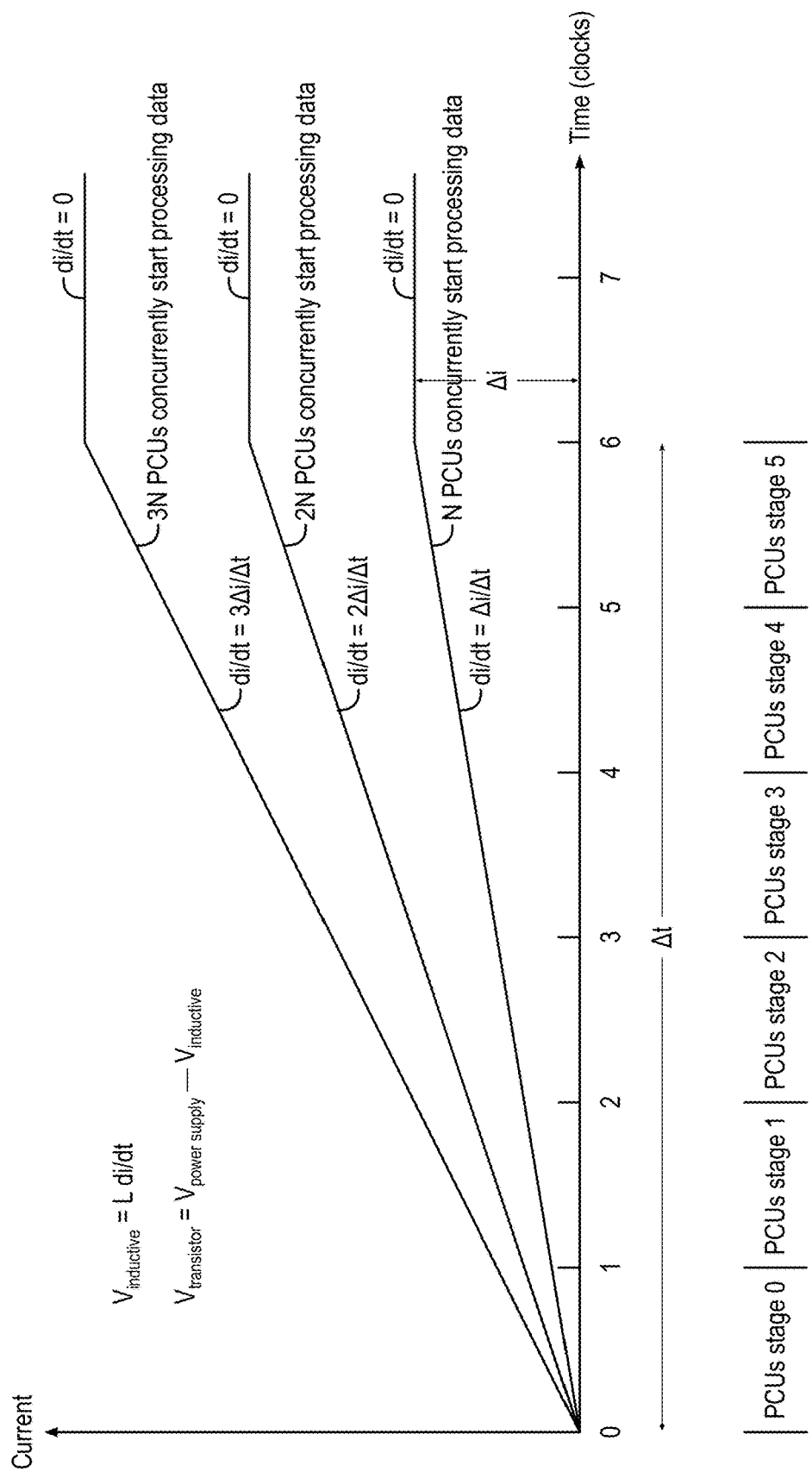
FIG. 14 is an example graph illustrating current ramps of an integrated circuit that embodies a SRDAP having PCUs in accordance with embodiments of the present disclosure.

FIG. 14 is an example graph illustrating current ramps of an integrated circuit that embodies a SRDAP having PCUs in accordance with embodiments of the present disclosure. The graph depicts current drawn by the integrated circuit as a function of time in clock cycles. In the example of FIG. 14, it is assumed that the PCUs have six stages, similar to the example PCU 520 of FIG. 5, i.e., each pipeline of the vector of L pipelines 1222 of the PCU 1200 of FIG. 12 has six FUs 1204 separated by PRs 1202, although in other embodiments the number of stages is different. The current drawn by the PCUs, and the time rate of change (di/dt) of the current drawn, is shown for seven clock cycles in FIG. 14. The current is also drawn through the inductive loads, and the voltage drop across the inductive loads is the product of the inductance of the inductive loads and the aggregate time rate of change of the current drawn by the SRDAP, di/dt, according to equation (1) above, which is also shown in FIG. 14. Furthermore, the supply voltage provided to the transistors of the SRDAP is the supply voltage provided by the power supply minus the voltage drop across the inductive loads per equation (2) above, which is also shown in FIG. 14, ignoring non-inductive voltage drop sources. When transitioning from not processing data to processing data, i.e., when starting to process data, each PCU makes an individual contribution to the aggregate di/dt, i.e., current ramp. In FIG. 14, three different examples of curves of current drawn by the SRDAP are shown, each representing a different number of PCUs that concurrently start processing data. The three numbers of PCUs are referred to as N, 2N, and 3N.

During clock 0 of FIG. 14, the input data to each PCU (e.g., from a PMU 1300) flows into stage 0 which causes the transistors of the stage 0 PRs 1202 and FUs 1204 to begin to draw current from the power supply as they process the first vector(s) of the input data, i.e., as they perform the operations with which they are statically reconfigured (e.g., matrix multiply, multiply, addition, exponent, division). The current draw is shown as a positive current ramp in FIG. 14 during clock 0. During clock 1, the results of stage 0 flow into stage 1 which causes the transistors of the stage 1 PRs 1202 and FUs 1204 to begin to draw current from the power supply as they process the stage 0 results while the transistors of stage 0 continue to draw current to process the next vector of input data.

During clock 2, the results of stage 1 flow into stage 2 which causes the transistors of the stage 2 PRs 1202 and FUs 1204 to begin to draw current from the power supply as they process the stage 1 results, while the next results of stage 0 flow into stage 1 which causes the transistors of the stage 1 PRs 1202 and FUs 1204 to begin to draw current from the power supply as they process the stage 0 results, while the transistors of stage 0 continue to draw current to process the next vector of input data. This process continues through stage 5 and clock 5. The example assumes, for simplicity of illustration, that each stage of each PCU draws approximately the same amount of current. Thus, a linear current ramp is shown having a positive slope through clocks 0 through 5, although it is understood that the actual current ramp curve may be non-linear. Although the example assumes six PCU pipeline stages, in some embodiments the pipelines of multiple PCUs may be effectively chained together to accomplish an effective pipeline length of up to 6N stages, where N is the number of chained PCUs.

During clocks 6 and 7, all six of the PCU stages are active processing data; hence, there is approximately no change in the amount of current drawn by the PCUs during the time of clocks 6 and 7, which is illustrated in FIG. 14 by a flat current ramp, i.e., the time rate of change of current, di/dt, is approximately zero, which means that the inductive voltage drop is approximately zero. However, the amount of current drawn is non-zero. With respect to the first (lower) curve in which only N PCUs start processing data concurrently at clock 0, the non-zero current by the end of clock 5 is shown in FIG. 14 as a current quantum "$\Delta i$", and the time during the 6 clock cycles 0 through 5 are shown in FIG. 14 as a time quantum "$\Delta t$". Thus, the aggregate current rate of change di/dt during clocks 0 through 5 when N PCUs start processing data concurrently is $\Delta i/\Delta t$, as shown. In comparison, aggregate di/dt during clocks 0 through 5 when 2N PCUs (i.e., twice as many) start processing data concurrently is twice as much, i.e., $2\Delta i/\Delta t$, as shown in the middle curve, and aggregate di/dt during clocks 0 through 5 when 3N PCUs (i.e., thrice as many) start processing data concurrently is thrice as much, i.e., $3\Delta i/\Delta t$, as shown in the upper curve. Thus, the inductive voltage drop is doubled when the number of PCUs that start processing data concurrently is doubled, and the inductive voltage drop is tripled when the number of PCUs that start processing data concurrently is tripled. Embodiments of control circuitry that is statically reconfigurable to control the current ramp to mitigate failures caused by inductive voltage drop will now be described.

Figure 15:
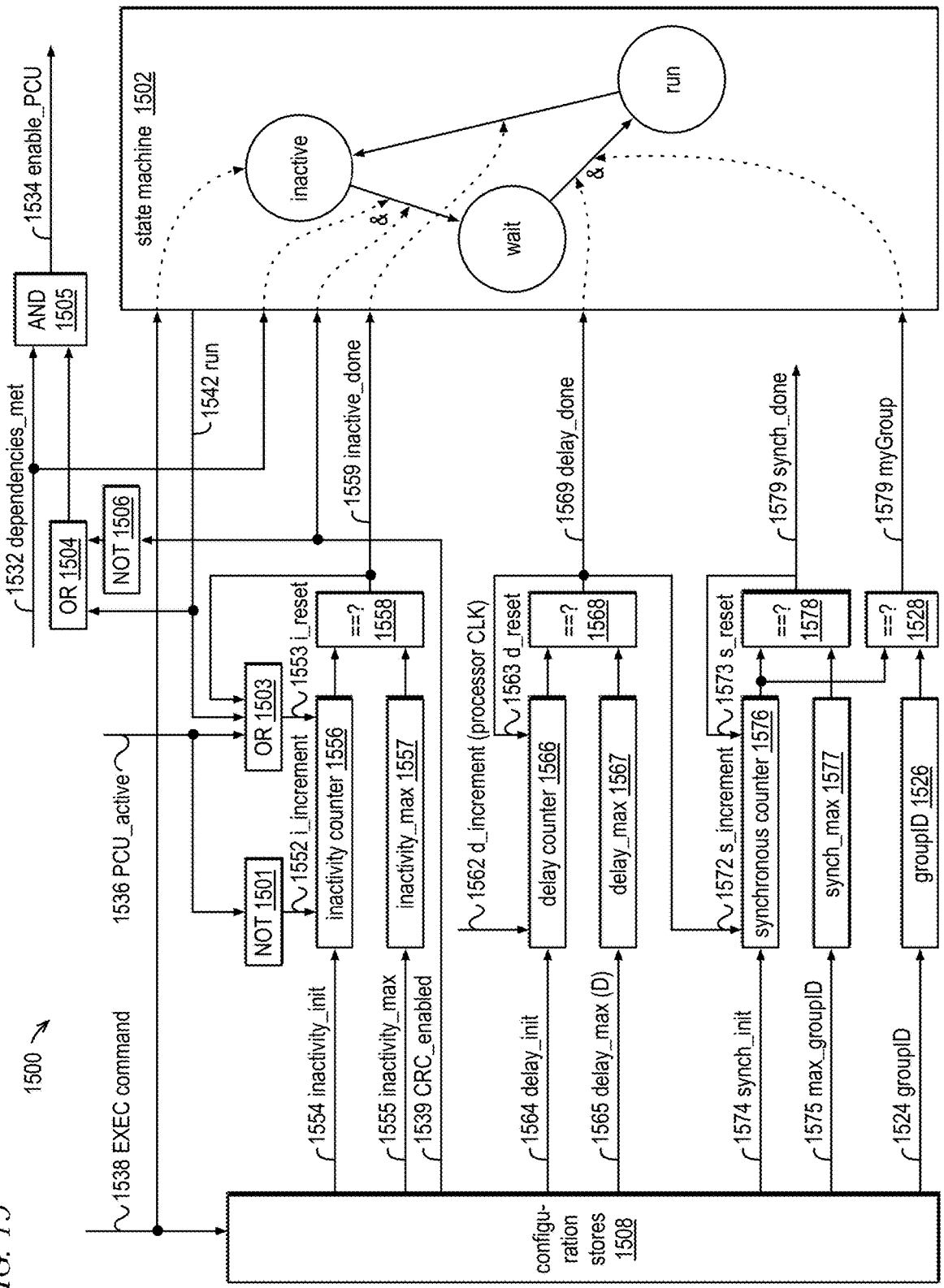
FIG. 15 is an example block diagram illustrating PCU control circuitry statically reconfigurable to perform current ramp control (CRC) in accordance with embodiments of the present disclosure.

FIG. 15 is an example block diagram illustrating PCU control circuitry 1500 statically reconfigurable to perform CRC in accordance with embodiments of the present disclosure. The control circuitry 1500 includes a first inverter 1501, a state machine 1502, a first OR gate 1503, a second OR gate 1504, an AND gate 1505, a second inverter 1506, configuration stores 1508, an inactivity counter 1556, a delay counter 1566, a synchronous counter 1576, a first register 1557, a second register 1567, a third register 1577, a fourth register 1526, a first comparator 1558, a second comparator 1568, a third comparator 1578, and a fourth comparator 1528. The first register 1557, a second register 1567, a third register 1577, a fourth register 1526, a first comparator 1558, a second comparator 1568, a third comparator 1578, and a fourth comparator 1528, some of which are comprised of control block 1212 and counters 1214 of FIG. 12.

The configuration stores 1508 (e.g., configuration stores 402 of FIG. 4 or configuration stores 528 of FIG. 5 or configuration stores 1208 of FIG. 12) are loaded with configuration data, e.g., generated by the CRC pass 627 of the compiler 620 of FIG. 6, for example, that is used to statically reconfigure the PCU (e.g., PCU 1200 of FIG. 12) prior to the processing of data by the PCUs according to a dataflow graph. In response to an EXEC command 1538 received from a MAGCU (e.g., MAGCU1 or MAGCU2 of FIG. 3), the configuration stores 1508 initialize the following elements with the following values: the inactivity counter 1556 with inactivity_init 1554, the delay counter 1566 with delay_init 1564, the synchronous counter 1576 with delay_init 1574, the first register 1557 with inactivity_max 1555 that is shown as inactivity_max 1557 stored in the first register 1557, the second register 1567 with a delay_max 1565 value that is shown as delay_max 1567 stored in the second register 1567, the third register 1577 with max_groupID 1575 that is shown as synch_max 1577 stored in the third register 1577, and the fourth register 1526 with groupID 1524 that is shown as groupID 1526 stored in the fourth register 1526. The inactivity_init 1554 value is zero. The delay_max 1565 value is also referred to herein as "D", or inter-group start delay, and is the minimum number of clock cycles (of the processor clock, referred to as processor CLK) of delay that the control circuitry 1500 of the PCUs of the array collectively enforces between the clock cycle in which a group of PCUs concurrently transition from not processing data to processing data, i.e., starts up, and the clock cycle in which the next temporally adjacent group of PCUs concurrently start up (i.e., the next group of PCUs in time that concurrently starts up), as may be observed from the following description. The max_groupID 1575 is the highest groupID value among the PCU groups. For example, if there are N PCU groups, then the max_groupID 1575 value would be N−1. The groupID 1524 identifies the PCU group to which the PCU belongs, which is generated by the CRC pass 627.

The first comparator 1558 compares the output/value/ count of the inactivity counter 1556 with the inactivity_max 1557 value and if they match generates a true value on an inactivity_done 1559 signal that is provided to the state machine 1502. The inactivity_done 1559 signal is also provided as an input to OR gate 1503. The OR gate 1503 also receives as inputs a run 1542 signal provided by the state machine 1502 and a PCU_active 1536 signal. When the run 1542 signal is true, this indicates the state machine 1502 is in the run state, as described in more detail below. When the PCU_active 1536 signal is true, this indicates the PCU is currently processing data, which means the PCU is currently drawing current from the power supply and through the inductive loads. A true value of the output of the OR gate 1503 (i.e., inactivity_done 1559, run 1542, and/or PCU_active 1536 is true) operates as a reset signal (shown in FIG. 15 as i_reset 1553) to reset the inactivity counter 1556 to a zero value. The inactivity counter 1556 increments in response to a signal i_increment 1552 which is the output of inverter 1501 that inverts the PCU_active 1536 signal. Thus, the inactivity counter 1556 increments every clock cycle in which the PCU is inactive and counts the number of consecutive inactive cycles of the PCU which, if it reaches inactivity_max 1557, the first comparator 1558 will output a true value on the inactive_done 1559 signal that is provided to the state machine 1502.

The second comparator 1568 compares the output/value/count of the delay counter 1566 with the delay_max 1567 value and if they match generates a true value on a delay_done 1569 signal that is provided to the state machine 1502. A true value of the delay_done 1569 signal also operates as a reset signal (shown in FIG. 15 as d_reset 1563) to reset the delay counter 1566 to a zero value. Thus, the delay counter 1566 counts up from zero to delay_max 1567 (D) and repeats. The delay counter 1566 increments in response to a control signal d_increment 1562 which is a processor CLK signal. Thus, the delay counter 1566 increments each cycle of the processor CLK.

The third comparator 1578 compares the output/value/count of the synchronous counter 1576 with the synch_max 1577 value and if they match generates a true value on a synch_done 1579 signal. A true value of the synch_done 1579 signal also operates as a reset signal (shown in FIG. 15 as s_reset 1573) to reset the synchronous counter 1576 to a zero value. Thus, the synchronous counter 1576 counts up from zero to synch_max 1577 and repeats. The synchronous counter 1576 increments in response to a control signal s_increment 1572 which is the delay_done 1569 signal. Thus, the synchronous counter 1576 increments when the clock cycle in which the delay counter 1566 reaches the delay_max 1567 value, i.e., D. In other words, the synchronous counter 1576 increments every D clock cycles and retains its current value between increments, i.e., during the remaining D clock cycles.

The fourth comparator 1528 compares the output/value/count of the synchronous counter 1576 with the groupID 1526 value and if they match generates a true value on a myGroup 1579 signal that is provided to the state machine 1502. Thus, a true value of the myGroup 1579 signal indicates the synchronous counter 1576 has counted to the groupID 1526 of the PCU group to which the PCU belongs, as described in more detail below.

Further in response to the EXEC command 1538, the delay counter 1566 starts incrementing from its delay_init 1564 value at the frequency of the processor CLK signal, as described above. The EXEC command 1538 is broadcast from the MAGCU to all the PCUs in the array (e.g., CGR array 400 of FIG. 4). The EXEC command 1538 travels from the MAGCU to the PCUs through the switches (e.g., S 403 of FIG. 4) of the array 400. As a result, PCUs closer to the MAGCU receive the EXEC command 1538 sooner than PCUs farther away and consequently begin incrementing sooner. That is, there is a time delta between when the closest and farthest PCUs receive the EXEC command 1538, and the time delta may be different for different PCUs depending upon their location within the array relative to the MAGCU. Therefore, the CRC pass 627 generates the delay_init 1564 values in a skewed manner such that each PCU's delay_init 1564 value is dependent upon the distance of the PCU from the MAGCU. That is, PCUs closer to the MAGCU will have a smaller delay_init 1564 value than PCUs farther away. For example, the CRC pass 627 may generate a value of zero for a PCU immediately spatially adjacent to the MAGCU, whereas the CRC pass 627 may generate a value of seven for a PCU that is seven clock cycles away from the MAGCU. Advantageously, this ensures that once the farthest PCU receives the EXEC command 1538 and its delay counter 1566 begins incrementing, delay counter 1566 value/count will be the same as the value/count of all the other delay counters 1566 of all the other PCUs of the array 400. This causes the value/count of the synchronous counters 1576 of all the PCUs of the array to be the same once the farthest PCU receives the EXEC command 1538 and its synchronous counter 1576 begins incrementing (because its corresponding delay counter 1566 reached the delay_max 1565 value). The fact that all the synchronous counters 1576 of the array have the same value facilitates the concurrent startup of PCUs by groups since each PCU may compare (i.e., comparator 1528) against the groupID 1526 of the PCU to know whether it is eligible to startup processing data or is prevented from processing data.

If the number of PCUs of the array is such that the time delta between when the closest and farthest PCUs receive the EXEC command 1538 is larger than the delay_max 1565 value, then the CRC pass 627 may also generate skewed synch_init 1574 values, i.e., non-zero values for some distant PCUs, such that once the farthest PCU receives the EXEC command 1538 and its synchronous counter 1576 begins incrementing, its value/count will be the same as the value/count of all the other synchronous counters 1576 of the array 400.

In addition to the inactive_done 1559, delay_done 1569, myGroup 1579, and EXEC command 1538 signals, the state machine 1502 also receives a dependencies_met 1532 signal and a CRC_enabled 1539 signal. The dependencies_met 1532 signal may be generated by the control block 1212 of the PCU based on dataflow control tokens received from other units of the array, e.g., switches, PMUs, and/or AGCUs. A true value of the dependencies_met 1532 signal indicates that all dependencies for the PCU to start processing data (e.g., to activate its FUs 1204) are met. For example, if the input data to be processed by the PCU is not yet available (e.g., within one or more PMUs from which the PCU receives the input data), then the dependencies_met 1532 signal will be false. For another example, if the buffer space (e.g., within one or more PMUs) to which the PCU is configured to write its results is not yet available, then the dependencies_met 1532 signal will be false. The CRC_enabled 1539 signal is generated by the CRC pass 627 and provided by the configuration stores 1508. A true value on the CRC_enabled 1539 signal instructs the PCU to enforce the CRC paradigm on itself, i.e., instructs the PCU to condition its eligibility to start processing data on factors other than the dependencies_met 1532 signal, namely impose a delay between the startup of groups of PCUs, i.e., to stagger the eligibility of PCU groups to start processing data.

The AND gate 1505 generates an enable_PCU 1534 signal that controls whether the PCU processes data, e.g., activates its FUs 1204. The enable_PCU 1534 signal is true if the dependencies_met 1532 signal is true and the output of OR gate 1504 is true. The output of OR gate 1504 is true if the state machine 1502 is in the run state (as indicated by a true value on the run 1542 signal) or the CRC_enabled 1539 signal is false, as indicated to the OR gate 1504 by the output of inverter 1506 that inverts the CRC_enabled 1539 signal.

The state machine 1502 has three states: inactive, wait, and run. When the EXEC command 1538 is received, the state machine 1502 is reset to the inactive state. The state machine 1502 transitions from the inactive state to the wait state in response to a true value on both the dependencies_met 1532 signal and the CRC_enabled 1539 signal. The state machine 1502 transitions from the wait state to the run state in response to a true value on both the delay_done 1569 signal and the myGroup 1579 signal. Assuming CRC_enabled 1539 is true, by operation of the state machine 1502 the PCU is prevented from processing data (e.g., activating its FUs) unless the state machine 1502 is in the run state.

Once in the run state, the inactivity counter 1556 counts the number of consecutive inactive cycles of the PCU, as described above. The inactive cycles may be due to the unavailability of input data, the unavailability of buffer space to receive the results of the PCU (also referred to as back pressure), or other reasons. The state machine 1502 stays in the run state while the inactive counter 1556 stays below the inactivity_max 1557. However, in response to a true value on the inactive_done 1559 signal, the state machine 1502 transitions from the run state to the inactive state, which prevents the FUs from processing data, i.e., from drawing current and contributing to voltage droop. As described above, e.g., with respect to FIG. 14, once the data processing within the PCU reaches a steady state, di/dt is relatively small. However, once the PCU stops processing data, e.g., the FUs are inactive, the current drawn by the PCU is relatively small such that when the PCU starts processing data again it may contribute to the aggregate di/dt of the SRDAP. Therefore, to mitigate voltage droop, the inactivity counter 1556 advantageously provides a way to detect that the PCU needs to be subject again to the CRC regime and wait its PCU group's turn to start up again after the prescribed inter-group start delay.

Because different PCUs within a group may have different characteristics, e.g., are statically reconfigured to perform different operations and/or to receive different input data and/or provide results to different buffers, some PCUs within a group could transition to inactive state while other PCUs within the same group remain in the run state. The inactive PCUs of the group may subsequently transition from the inactive state to the wait state and then to the run state and join other running PCUs of the group. Since these PCUs are a subset of the group, i.e., the number of PCUs transitioning from inactive to wait to run is smaller than the total number of the group, when the subset transitions from not processing data to processing data, the subset will contribute to the current ramp and voltage droop less than the entire group would have, thus still satisfying the CRC regime.

In an embodiment, the value of inactivity_max 1555 is empirically determined by the CRC pass 627 based on analysis of the dataflow graph, such as the stability and timing patterns of templates or other operations. In an embodiment, the value of inactivity_max 1555 is constant for all PCUs of the array, although other embodiments are contemplated in which the value of inactivity_max 1555 may vary for different PCUs of different PCU groups and/or within a PCU group.

In an embodiment, the number of PCUs per group is the same for all PCU groups (except perhaps one group having a remnant of PCUs), however other embodiments are contemplated in which the PCUs per group may vary depending upon factors such as the types of operations performed by each PCU. For example, PCUs that perform systolic operations may belong to smaller PCU groups than PCUs that perform non-systolic operations. Furthermore, other embodiments are contemplated in which CRC is enforced only on PCUs that perform systolic operations. One or more PCUs that perform a systolic operation may be referred to as a systolic array being an array of ALUs through which data flows along multiple dimensions, i.e., two dimensions or more. A characteristic of a systolic array of PCU is that the activity of the ALUs (e.g., FUs 1204) can ramp up and ramp down quickly, and in the steady state all ALUs can be active every clock cycle.

Although FIG. 15 describes an embodiment in which the CRC is performed by the PCU control circuitry 1500 entirely within the PCU, other embodiments are contemplated in which at least a portion of the CRC is also included within switches and/or PMUs of the array, and other forms of control circuitry may be employed. For example, in an alternate embodiment, for each PCU group, when the current PCU group starts up it generates a barrier release token that is sent through the switches to each PCU of the next group. Reception of the token starts a countdown cycle timer within the next group of PCUs that count down from an inter-group initiation value. The expiration of the timer makes the PCU eligible to start processing data by clearing a barrier set up for the purpose of enforcing the CRC paradigm, i.e., it can start processing data once its dependencies are met. The expiration of the timer also triggers the reset of the timer back to the inter-group initiation value and disables the timer until reception of the token again, i.e., when the current PCU group starts back up again. The alternate embodiment spaces out the transition from not processing data to processing data by PCU groups by forcing a minimum delay (the inter-group initiation value) between the transitions.

FIG. 16 is an example flowchart illustrating operation of the compiler to generate configuration information with which to statically reconfigure a SRDAP to perform CRC in accordance with embodiments of the present disclosure. Operation begins at block 1602.

At block 1602, the compiler (e.g., compiler 620 of FIG. 6) compiles a user program or algorithm into a dataflow graph (DFG) that is realizable on one or more RDUs (also referred to herein as SRDAPs, CGRA processors, integrated circuits, or chips). The DFG specifies which graph operations will be performed by which physical PCUs, which PMUs will buffer data to and/or from which PCUs, how switches will connect PCUs and PMUs to direct the flow of data through the ALN, and so forth as described above. Operation proceeds to block 1604.

At block 1604, the compiler separates the PCUs into groups and assigns a unique groupID to each PCU group. To analyze the DFG to group the PCUs, the CRC pass 627 may examine the place and route (PNR) physical layout, physical data channels, port allocations, etc. (e.g., determined at block 1602 and as described above, e.g., with respect to FIG. 6). In an embodiment, the compiler limits the number of PCUs in a group to a predetermined number, referred to herein as "G", i.e., each PCU group has at most G PCUs.

The compiler may group the PCUs according to various criteria according to various embodiments. In an embodiment, the compiler may group the PCUs using a random algorithm. In an embodiment, the compiler may consider location within the array (e.g., array coordinates) in grouping the PCUs. In an embodiment, the compiler may analyze the DFG to determine current wavefronts and consider the location of PCUs with respect to the current wavefronts (and in some embodiments by additional bases such as array coordinates), as described below with respect to FIGS. 17 and 18. In an embodiment in which the integrated circuit that comprises the SRDAP includes multiple power domains, the compiler may consider DFG operations (e.g., a systolic operation that tends to contribute more steeply to current ramp) and attempt to cause a group of PCUs to straddle power domain boundaries, e.g., to place a first subset of PCUs of the group in one power domain and to place a second subset of PCUs of the group in a second power domain such that all the PCUs of the group may start up concurrently but only the smaller respective subsets of PCUs are contributing to the current ramp imposed upon the respective power supplies and drawn through the respective inductive loads, as described below with respect to FIG. 21. As described above, the compiler may populate different PCU groups with different numbers of PCUs based on analysis of the DFG, e.g., depending upon the particular operations performed by different PCUs. In an embodiment, the compiler enforces CRC only on PCUs that perform systolic operations. Generally, the CRC pass 627 may group the PCUs to minimize negative impact on performance of the execution of the DFG by the SRDAP. In an embodiment, the CRC pass 627 performs the operations at block 1604 and at block 1606 below. Operation proceeds to block 1606.

At block 1606, the compiler generates the configuration information, or configuration data, for statically reconfiguring the PCUs to accomplish current ramp control (CRC). For example, the compiler may generate the groupID and counter values (e.g., groupID 1524, inactivity_init 1554, inactivity_max 1555, delay_init 1564, delay_max 1565, synch_init 1574, and max_groupID 1575 of FIG. 15) for each PCU. The CRC configuration information may also include configuration information for statically reconfiguring switches and/or PMUs, as described above, in embodiments in which elements other than PCUs include control circuitry that performs CRC. For another example, the CRC configuration information may include control connections and start/stop conditions directed to alternate embodiments such as described above. Operation proceeds to block 1608.

At block 1608, the compiler generates a PEF, as described above, which includes the CRC configuration information generated at block 1606.

Figure 17:
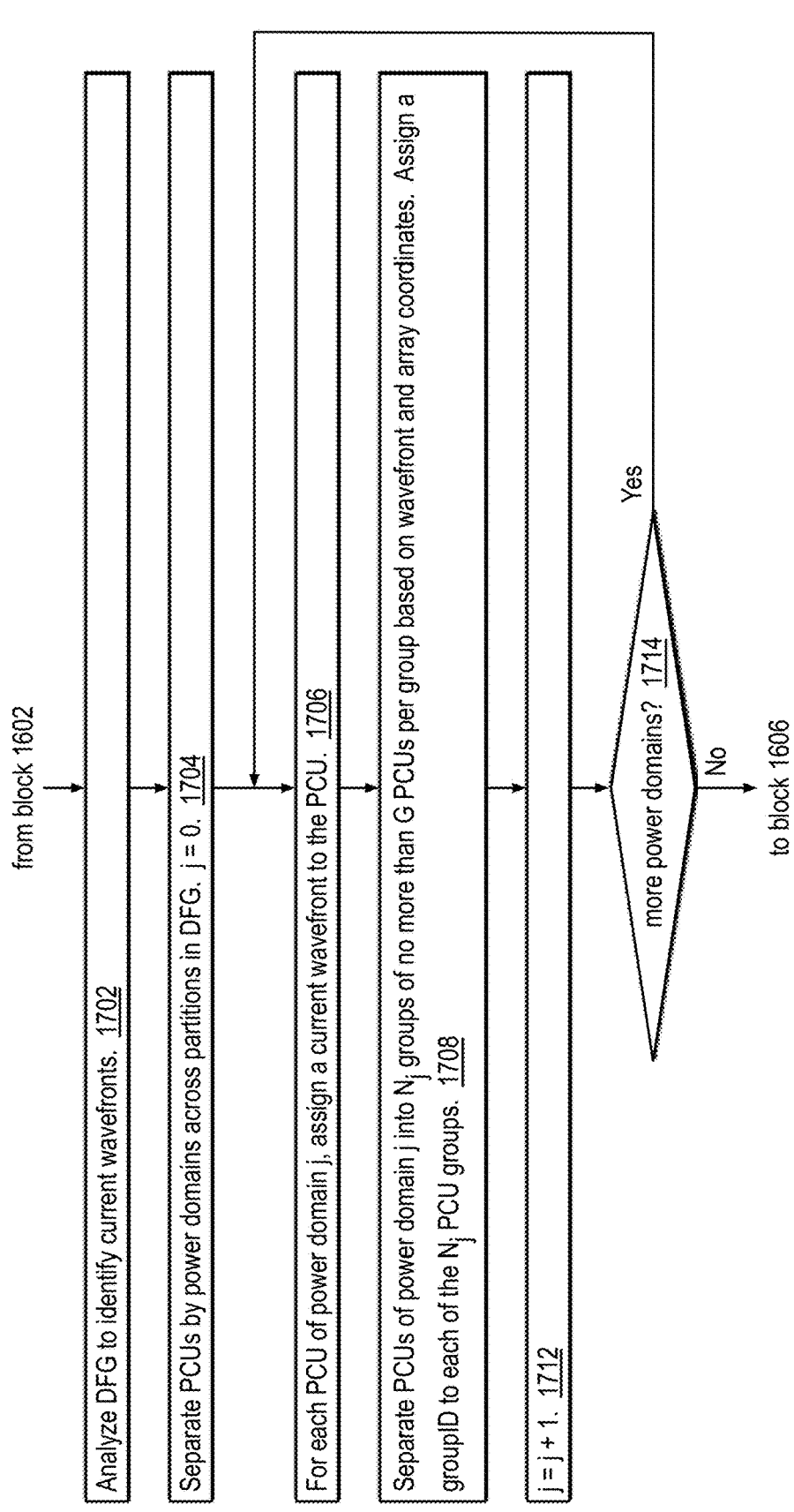
FIG. 17 is an example flowchart illustrating operation of the CRC pass of the compiler to separate PCUs into groups in accordance with embodiments of the present disclosure.
Figure 18:
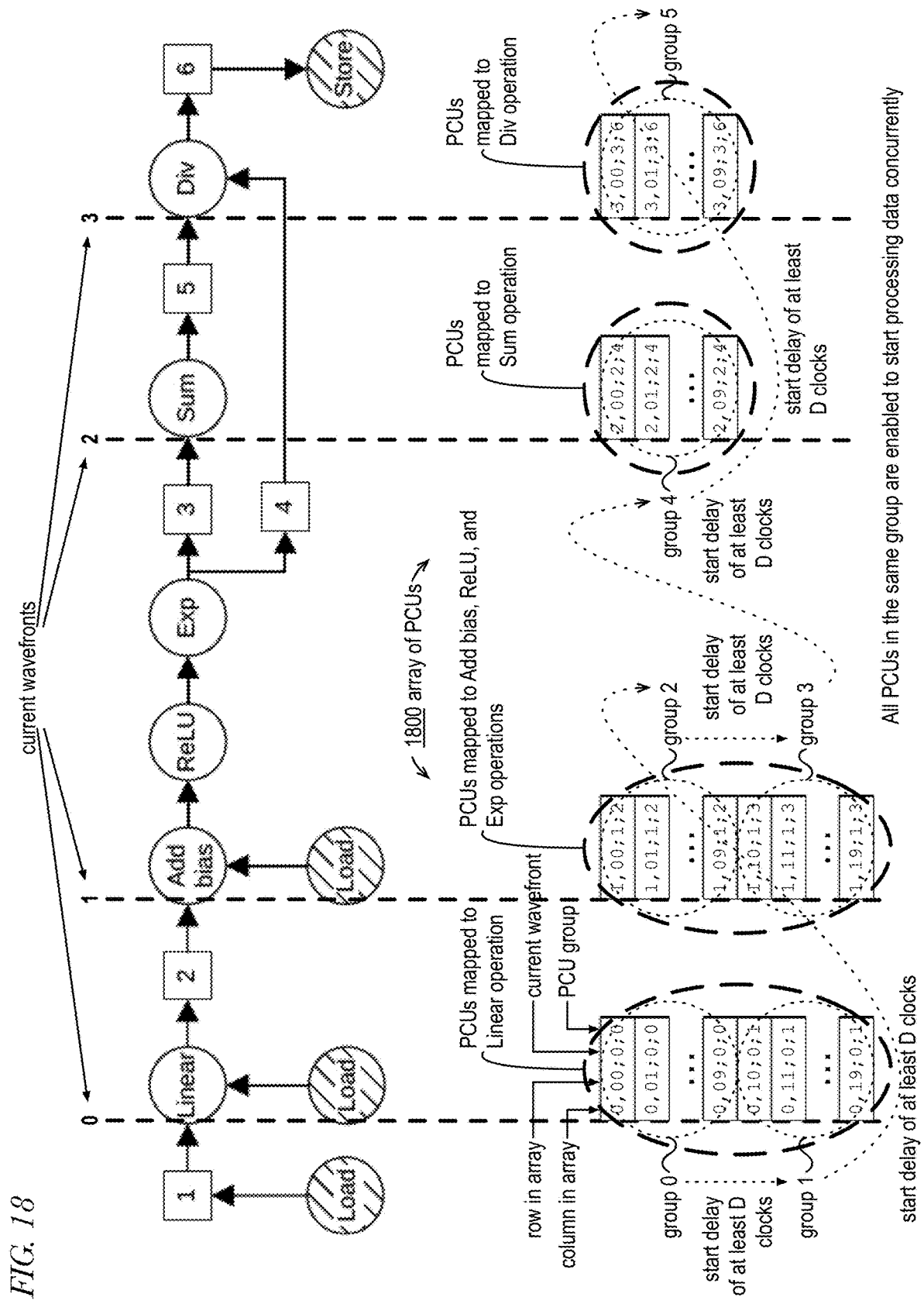
FIG. 18 is an example dataflow graph (DFG) and an example block diagram of an array of PCUs in accordance with embodiments of the present disclosure.

FIG. 17 is an example flowchart illustrating operation of the CRC pass of the compiler to separate PCUs into groups (e.g., according to block 1604 of FIG. 16) in accordance with embodiments of the present disclosure. FIG. 18 is an example DFG (the DFG of FIG. 11, which appears in the top portion of FIG. 18) and an example block diagram of an array of PCUs (which appears in the lower portion of FIG. 18) in accordance with embodiments of the present disclosure. FIG. 17 may be understood with reference to FIG. 18, whose DFG will now be summarized.

The arrows are edges of the DFG that represent the flow of data; the open circles are nodes of the DFG that represent operations; the squares represent buffers; the hatched circles are data transfer operations to/from the nodes/buffers. A first buffer receives data from external memory via a first Load operation. The Linear node receives its input data from the first buffer and from external memory via second Load operation. The Linear node performs its operation on its input data and provides its results to a second buffer. The Add bias node receives its input data from the second buffer and from external memory via third Load operation. The Add bias node performs its operation on its input data and provides its results to the ReLU node, which performs its operation on the Add bias results and provides its results to the Exp node, which performs its operation on the ReLu results and provides its results to a third buffer and one of its results to a fourth buffer. The Sum node receives its input data from the third buffer and performs its operation on its input data and provides its results to a fifth buffer. The Div node receives its input data from the fourth buffer and from the fifth buffer. The Div node performs its operation on its input data and provides its results to a sixth buffer, and those results are stored from the sixth buffer to external memory via a Store operation.

A given node operation cannot be performed until its input data is available. This is referred to as a dependency. More specifically, an operation A cannot start until completion of an operation B that provides input data to operation A (and completion of any other operations that provide input data to operation A). Thus, the Linear operation cannot be performed until the first and second Load operations have completed; the Add bias operation cannot be performed until the Linear and third Load operations have completed; the Sum operation cannot be performed until the Add bias, ReLU, and Exp operations have completed; and the Div operation cannot be completed until the Exp and Sum operations have completed. Each of the four dependencies of the DFG is shown in FIG. 18 as a current wavefront, i.e., a current wavefront 0 at the input to the Linear operation node, a current wavefront 1 at the input to the Add bias operation node, a current wavefront 2 at the input to the Sum operation node, and a current wavefront 3 at the input to the Div operation node. Each of the current wavefronts, with respect to the DFG, may be more aptly conceptualized as a data wavefront, or operational wavefront, since data flows through the nodes of the DFG in waves that are caused by the data dependencies of the DFG. However, the compiler maps the DFG to hardware of an integrated circuit that executes the DFG, which involves the integrated circuit drawing current from a power supply, and which involves a time rate of change of current flow through inductive loads that could cause voltage droop/overshoot. Hence, the data/operational wavefronts are referred to as current wavefronts.

More specifically, the compiler maps DFG nodes to compute units (e.g., PCUs) that perform the operations; the compiler maps the DFG buffers to memory internal to the integrated circuit (e.g., PMUs); the compiler maps the Load operations to AGCUs that perform data transfers to the PMUs or PCUs from memory external to the integrated circuit (e.g., host memory) and maps Store operations to AGCUs that perform data transfers from the PMUs or PCUs to external memory; the compiler maps the DFG edges to switch ports through which data flows between the PCUs and PMUs. The switches control the flow of data based on the availability of buffers and result data.

In the lower portion of FIG. 18, PCUs of the integrated circuit are shown as an array of rows and columns. For simplicity and clarity of illustration, only PCUs are shown in the array, i.e., PMUs and switches are not shown. In the example, the PCUs are homogenous with respect to their ability to process data such that any PCUs that are statically reconfigured in substantially the same manner (e.g., statically reconfigured to perform the same operations of a DFG)

draw current at substantially the same rate. Shown are the PCUs that are mapped to the Linear operation, the PCUs that are mapped to the Add bias, ReLU, and Exp operations, the PCUs that are mapped to the Sum operation, and the PCUs that are mapped to the Div operation. In the example of FIG. 18, twenty PCUs are mapped to the Linear operation, twenty PCUs are mapped to the Add bias, ReLU, and Exp operations, ten PCUs are mapped to the Sum operation, and ten PCUs are mapped to the Div operation, as shown. The mapping may be performed by the compiler at block 1602 of FIG. 16. In the example of FIG. 18, more PCUs are mapped to each of the various operations of the DFG than in the example physical layout 1150 of FIG. 11 in which a smaller number of PCUs (and PMUs) are mapped to the operations for ease of illustration. Operation proceeds from block 1602 of FIG. 16 to block 1702 of FIG. 17.

At block 1702, the CRC pass 627 analyzes the DFG to identify current wavefronts. As described above using the example of FIG. 18, the CRC pass 627 follows edges of the DFG and identifies a current wavefront at the input to an operational node that has a dependency on input data. Thus, wavefronts are a characterization of the order in which nodes of the DFG can perform their operations. A current wavefront may occur at a node that must wait to start its operation until its input data is available. The input data may be the result(s) of one or more previous operations performed by other nodes in the DFG, in which case the previous operation(s) must be completed before the operations of the node at a current wavefront may occur. Operation proceeds to block 1704.

At block 1704, the CRC pass 627 separates PCUs of the integrated circuit by power domains across partitions in the DFG. A power domain is a portion of the integrated circuit that is supplied power by a power supply, and each PCU is within a power domain, i.e., is supplied power by a single power supply. In some embodiments, the integrated circuit includes multiple power domains each supplied power by a different respective power supply. Generally speaking, the inductive loads that may cause voltage droop/overshoot are also separated by power domain. In some embodiments, an integrated circuit has only one power domain. A partition is a tuple of an integrated circuit identifier and a section identifier. In some embodiments, a system may include multiple integrated circuits, and the compiler may map a DFG to span multiple integrated circuits. A section is part of a graph that can be executed in a single program load event on an integrated circuit, i.e., a single load of configuration data onto the integrated circuit. The CRC pass 627 also assigns a value of zero to a power domain index referred to as j. Operation proceeds to block 1706.

At block 1706, for each PCU of power domain j, the CRC pass 627 assigns a current wavefront to the PCU. That is, the CRC pass 627 assigns to each PCU the wavefront identifier associated with the node whose operation the PCU was mapped to perform. As shown in the example of FIG. 18, the twenty PCUs to which the Linear operation is mapped—which are in rows 0 through 19 of column 0 of the array—are assigned current wavefront 0; the twenty PCUs to which the Add bias, ReLU, and Exp operations are mapped—which are in rows 0 through 19 of column 1 of the array—are assigned current wavefront 1; the ten PCUs to which the Sum operation is mapped—which are in rows 0 through 9 of column 2 of the array—are assigned current wavefront 2; and the ten PCUs to which the Div operation is mapped—which are in rows 0 through 9 of column 3 of the array—are assigned current wavefront 3. In an embodiment, the CRC pass 627 detects a condition in which two or more operations of the DFG are in the same wavefront, i.e., they have the same data dependencies, but one or more of the operations has a different characteristic (e.g., a different activity pattern) such that the CRC pass 627 creates a new wavefront for the operation with the different characteristic. For example, a first type of operation may tend to experience inactivity (i.e., inactivity for inactivity_max 1557 consecutive clock cycles) more frequently than a second type of operation. In such a case, the CRC pass 627 may split the wavefront into two wavefronts and place the operation of the first type in the earlier wavefront and place the operation of the second type in the later wavefront. Placing the operation of the first type in the earlier wavefront may result in the PCUs mapped to the operation of the first type being assigned a lower groupID (per operation of blocks 1706 and 1708 as described below) which may result in PCUs of the operation of the first type getting to start processing data sooner than the PCUs mapped to the operation of the second type. Operation proceeds to block 1708.

At block 1708, the CRC pass 627 separates the PCUs of power domain j into groups of not more than G PCUs per group. The number of PCU groups in the power domain is referred to as $N_j$, and the PCU groups are identified as groupIDs 0 through $N_j-1$. The CRC pass 627 assigns to each PCU the groupID to which it belongs, i.e., a value of 0 through $N_j-1$. In an embodiment, the CRC pass 627 separates the PCUs of the power domain based on the array coordinates of the PCU and the current wavefront identifier assigned to the PCU at block 1706. In the example of FIG. 18, a single power domain is assumed, and the PCUs of wavefront 0 in rows 0 through 9 of column 0 have groupID 0, the PCUs of wavefront 0 in rows 10 through 19 of column 0 have groupID 1, the PCUs of wavefront 1 in rows 0 through 9 of column 1 have groupID 2, the PCUs of wavefront 1 in rows 10 through 19 of column 1 have groupID 3, the PCUs of wavefront 2 in rows 0 through 9 of column 3 have groupID 4, and the PCUs of wavefront 3 in rows 0 through 9 of column 3 have groupID 5. FIG. 18 also shows the delays of at least D clock cycles enforced between the six different PCU groups transitioning from not processing data to processing data. More specifically, PCU group 0 starts processing data first, then D or more clocks later PCU group 1 is eligible to start processing data, then D or more clocks later PCU group 2 is eligible to start processing data, then D or more clocks later PCU group 3 is eligible to start processing data, then D or more clocks later PCU group 4 is eligible to start processing data, then D or more clocks later PCU group 5 is eligible to start processing data, and this process repeats until the integrated circuit has completed processing the DFG, or at least the section of the DFG it has presently been configured to process. Operation proceeds to block 1712.

At block 1712, the CRC pass 627 increments the power domain index j. Operation proceeds to decision block 1714.

At decision block 1714, if there are more power domains to analyze, i.e., if the power domain index j is less than the total number of power domains determined at block 1704, then operation returns to block 1706; otherwise, operation proceeds to block 1606 of FIG. 16.

Figure 19:
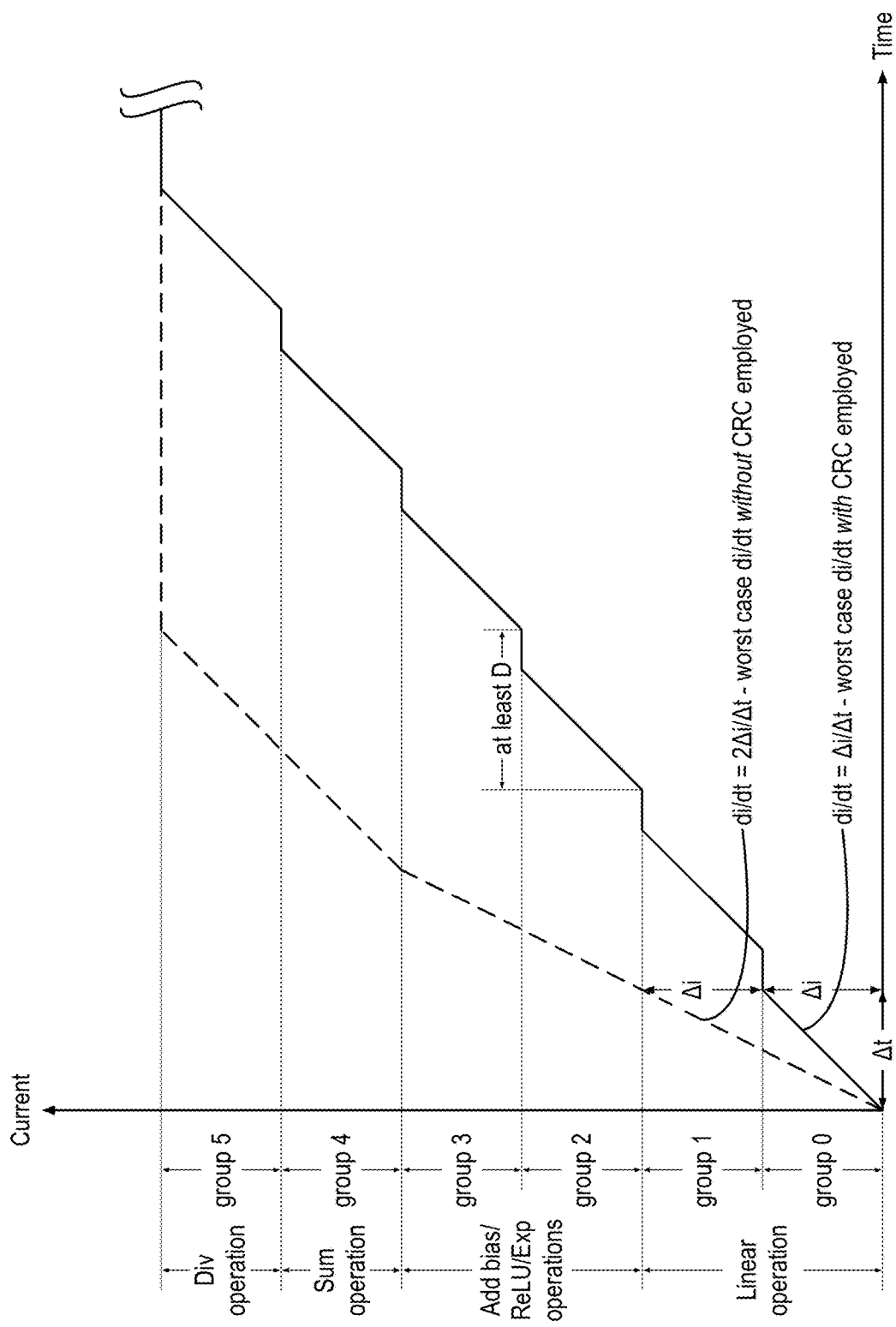
FIG. 19 is an example graph illustrating current ramps of an integrated circuit that embodies a SRDAP having PCUs in accordance with embodiments of the present disclosure.

FIG. 19 is an example graph illustrating current ramps of an integrated circuit that embodies a SRDAP having PCUs in accordance with embodiments of the present disclosure. The graph depicts current drawn by the integrated circuit as a function of time. The graph illustrates current ramps with respect to the DFG and associated current wavefronts of FIG. 18. Two curves are shown: a curve during which the integrated circuit employs an embodiment of CRC (solid curve) and a curve during which it does not (dashed curve) to facilitate a comparison to illustrate effects of CRC. As may be observed, the worst case di/dt is less (half in the example) when CRC is employed than when it was not, as will now be described in more detail.

At time 0, when CRC is employed, as indicated with the solid curve, the 10 PCUs of group 0 start processing data to perform their portion of the Linear operation. In the example, a time of $\Delta t$ is required for the PCUs of group 0 to reach a steady state of current draw, i.e., to cause essentially no time rate of change of current, i.e., a di/dt of approximately zero, as shown. During the $\Delta t$, the current increases by an amount $\Delta i$. Thus, the startup of group 0 causes a current ramp of $di/dt=\Delta i/\Delta t$. After a delay of at least D clocks is enforced from the startup of group 0, the 10 PCUs of group 1 start processing data to perform their portion of the Linear operation, and the startup of group 1 causes another current ramp of $di/dt=\Delta i/\Delta t$. After another delay of at least D clocks is enforced from the startup of group 1, the 10 PCUs of group 2 start processing data to perform their portion of the Add bias/ReLU/Exp operations, and the startup of group 2 causes another current ramp of $di/dt=\Delta i/\Delta t$. After another delay of at least D clocks is enforced from the startup of group 2, the 10 PCUs of group 3 start processing data to perform their portion of the Add bias/ReLU/Exp operations, and the startup of group 3 causes another current ramp of $di/dt=\Delta i/\Delta t$. After another delay of at least D clocks is enforced from the startup of group 3, the 10 PCUs of group 4 start processing data to perform their portion of the Sum operation, and the startup of group 4 causes another current ramp of $di/dt=\Delta i/\Delta t$. After another delay of at least D clocks is enforced from the startup of group 4, the 10 PCUs of group 5 start processing data to perform their portion of the Sum operation, and the startup of group 5 causes another current ramp of $di/dt=\Delta i/\Delta t$. Thus, $di/dt=\Delta i/\Delta t$ is the worst case current ramp to execute the DFG with CRC employed.

At time 0, when CRC is not employed, as indicated with the dashed curve, all 20 of the PCUs mapped to the Linear operation (associated with current wavefront 0) start processing data. In the example, a time of $\Delta t$ is required for the 20 PCUs mapped to the Linear operation to reach a steady state of current draw, i.e., to cause essentially no time rate of change of current, i.e., a di/dt of approximately zero. During the $\Delta t$, the current increases by an amount $2\Delta i$ since twice as many PCUs startup relative to the startup of the 10 group 0 PCUs when CRC is employed. Thus, the startup of the 20 PCUs mapped to the Linear operation causes a current ramp of $di/dt=2\Delta i/\Delta t$. For simplicity of illustration, the example assumes no latency through the buffers, i.e., that the results produced by the PCUs that perform an operation are immediately available for the PCUs that perform the next operation. Thus, when the results of the Linear operation begin to be available, the 20 PCUs mapped to the Add bias/ReLu/Exp operations (associated with current wavefront 1) start processing data, and the startup of the 20 PCUs mapped to the Add bias/ReLu/Exp operations causes another current ramp of $di/dt=2\Delta i/\Delta t$. When the results of the Add bias/ReLU/Exp operations begin to be available, the 10 PCUs mapped to the Sum operation (associated with current wavefront 2) start processing data, and the startup of the 10 PCUs mapped to the Sum operation causes a current ramp of $di/dt=\Delta i/\Delta t$. When the results of the Sum operation begin to be available, the 10 PCUs mapped to the Div operation (associated with current wavefront 3) start processing data, and the startup of the 10 PCUs mapped to the Div operation causes another current ramp of $di/dt=\Delta i/\Delta t$. Thus, $di/dt=2\Delta i/\Delta t$ is the worst case current ramp to execute the DFG with CRC not employed.

The maximum PCU group size G and the inter-group delay D clock cycles employed in the CRC are predetermined to mitigate operational failures of the integrated circuit due to voltage droop caused by current ramps through inductive loads. In the example of FIG. 19, because the number of PCUs mapped to perform the Linear operation for example is greater than G by a factor of two, the worst case current ramp when CRC is not employed is twice when CRC is employed, and the larger current ramp experienced in the absence of CRC could be sufficient to result in operational failures of the integrated circuit caused by voltage droop. In other DFGs the number of PCUs mapped to perform an operation may be even greater than G by a factor significantly larger than two, which may even further increase the likelihood of a current ramp that causes voltage droop sufficient to result in operational failures of the integrated circuit when CRC is not employed.

The graph of FIG. 19 is an example of the current that may be drawn by the integrated circuit over time and is provided for illustration of CRC operation through comparison with operation of the integrated circuit without CRC. However, it should be understood that the current draw over time may be different than shown in FIG. 19 (and FIG. 22 described below) depending on various factors such as whether some of the operations take longer to complete than others, whether or not there are inactive clock cycles, e.g., caused by temporary input data or output buffer unavailability as illustrated by example in FIG. 20, and whether fewer than all the pipeline stages of the PCUs of an operation are needed to perform the operation.

Figure 20:
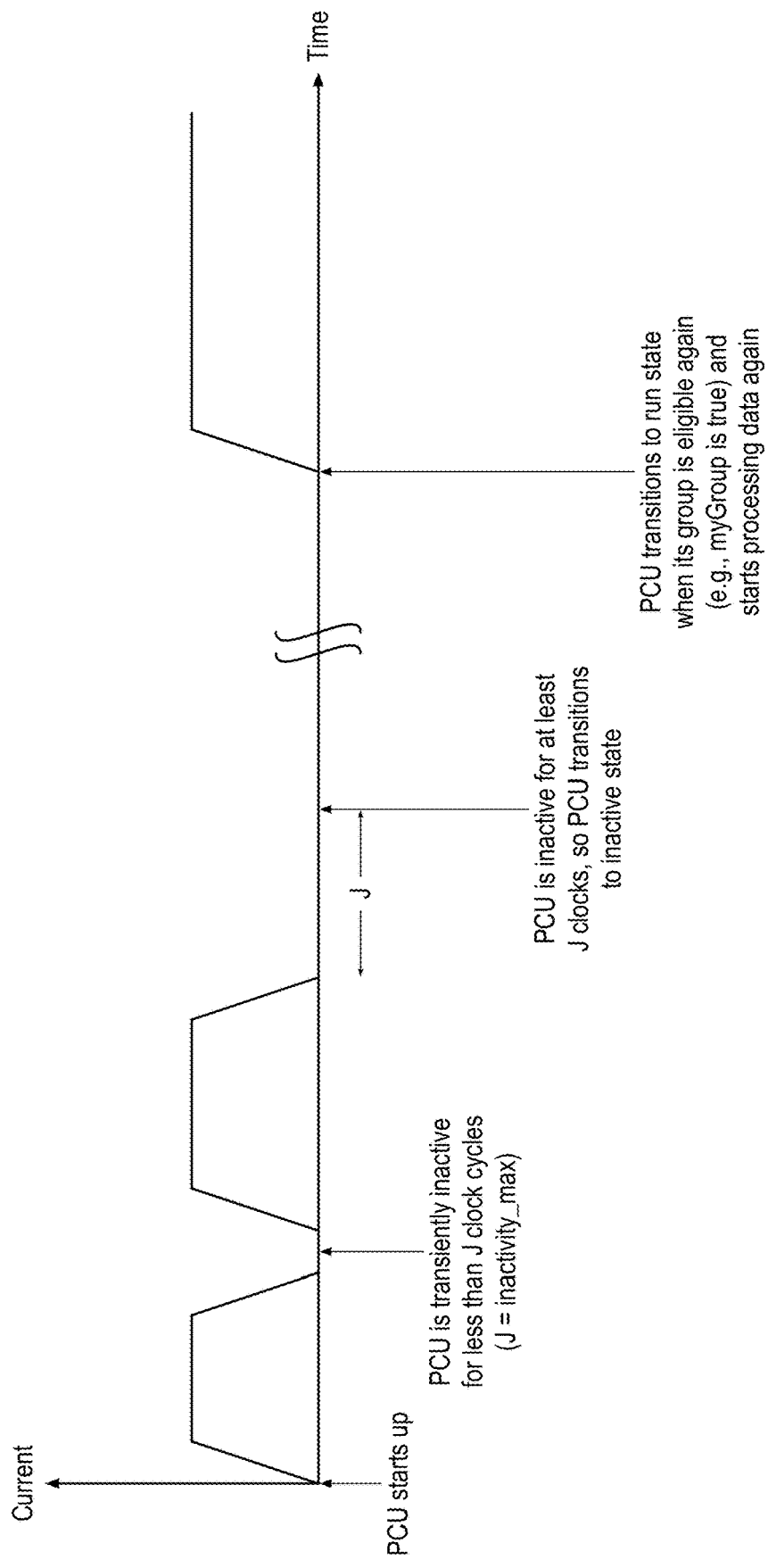
FIG. 20 is an example graph illustrating operation of inactivity counters used in current ramp control in accordance with embodiments of the present disclosure.

FIG. 20 is an example graph illustrating operation of inactivity counters used in current ramp control in accordance with embodiments of the present disclosure. The graph depicts current drawn by a single PCU of the integrated circuit as a function of time. At time 0, the PCU starts up processing data, i.e., transitions from not processing data to processing data, which results in a current ramp, as shown, that levels out to a constant current draw. Subsequently, the PCU experiences a transient of consecutive inactive clock cycles—which causes the inactivity counter 1556 of FIG. 15 to increment. However, the number of clock cycles of transient inactivity is less than inactivity_max 1557, which is referred to in FIG. 20 as J. As a result, when the cause of inactivity is gone (e.g., input data and/or output buffer space becomes available), the PCU resumes processing data, which results in another current ramp that levels out to a constant current draw. Subsequently, the PCU experiences J or more consecutive inactive clock cycles, which causes the inactive_done 1559 signal to go true. As a result, the PCU state machine 1502 transitions from the run state to the inactive state. The state machine 1502 will eventually transition from the inactive state to the wait state when dependencies_met 1532 is true. Once myGroup is true (i.e., the synchronous counter 1576 value matches the groupID 1526 value) such that the PCU's group is eligible to start up again, the PCU starts processing data again, which results in a current ramp that levels out to a constant current draw. Although PCU inactivity detection has been described in FIG. 20 with respect to the embodiment of the control circuitry 1500 of FIG. 15, other control circuitry embodiments may also prevent the PCU from starting back up processing data until its PCU group has subsequently become eligible to start up again.

FIGS. 21A, 21B, 21C, and 21D, referred to collectively as FIG. 21, are example block diagrams illustrating operation of the compiler to map templates to PCUs based on power domains to facilitate current ramp control in accordance with embodiments of the present disclosure. In each of FIGS. 21A-D, an integrated circuit 2101 is shown that includes two power domains, referred to as power domain 0 and power domain 1. In each of FIGS. 21A-D, two templates are shown, referred to as GeMM A and GeMM B. Each GeMM template is representative of a set of physical PCUs that are statically reconfigurable to perform a general matrix multiply operation (i.e., to multiply an M×K matrix and a K×N matrix to produce an M×N matrix) of a DFG, which may often require a very large number of multiply-accumulates when used in neural networks. The GeMM templates may be representative of templates that are observed to contribute to higher current ramps relative to other templates. As described above, the inductive loads that contribute to voltage droop/overshoot are generally associated with each power domain. Hence, current ramp control is generally analyzed and enforced on a per power domain basis. FIGS. 21A-D describe four different approaches taken by the compiler in mapping the GeMM templates relative to power domains, as will now be described. It is assumed in the examples that the number of PCUs needed to perform each of GeMM A and GeMM B is significantly larger than G, the maximum size of a PCU group.

Figure 21B:
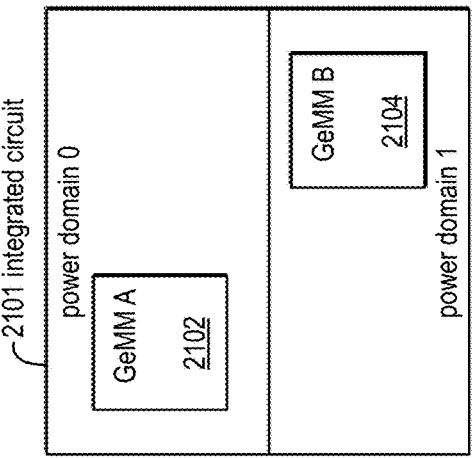
FIGS. 21A, 21B, 21C, and 21D, referred to collectively as FIG. 21, are example block diagrams illustrating operation of the compiler to map templates to PCUs based on power domains to facilitate current ramp control in accordance with embodiments of the present disclosure.
Figure 21D:
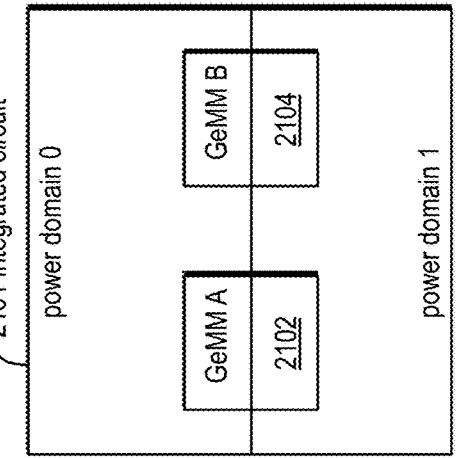
Figure 21A:
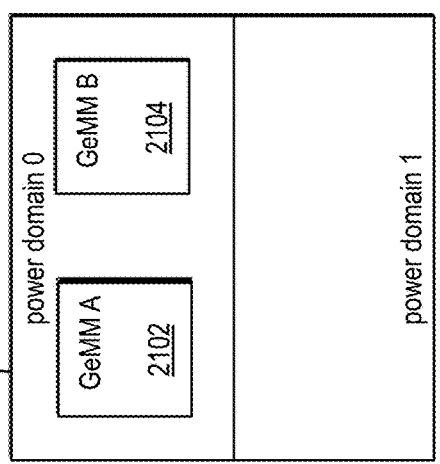

In FIG. 21A, the compiler maps both GeMM A and GeMM B to PCUs that are in the same power domain, e.g., in power domain 0. Hence, all the PCUs of both GeMM A and GeMM B will draw current through the same inductive loads and will therefore need to be accounted for by the CRC pass 627. More specifically, the CRC pass 627 include the sum of the number of PCUs from both GeMM A and GeMM B (along with the PCUs of other operations of the DFG) in the total pool of PCUs for power domain 0 to separate into PCU groups.

In FIG. 21B, the compiler maps GeMM A and GeMM B to PCUs that are in power domain 0 and power domain 1, respectively, i.e., in different power domains. Hence, the PCUs of GeMM A will draw current through the inductive loads associated with power domain 0, and the PCUs of GeMM B will draw current through the inductive loads associated with power domain 1. Thus, the CRC pass 627 need only account for the PCUs of GeMM A with respect to power domain 0 and need only account for the PCUs of GeMM B with respect to power domain 1. More specifically, the CRC pass 627 need include only the number of PCUs from GeMM A in the total pool of PCUs for power domain 0, and independently need include only the number of PCUs from GeMM B in the total pool of PCUs for power domain 1, which may facilitate an improvement from a performance perspective relative to the mapping of FIG. 21A.

Figure 21C:
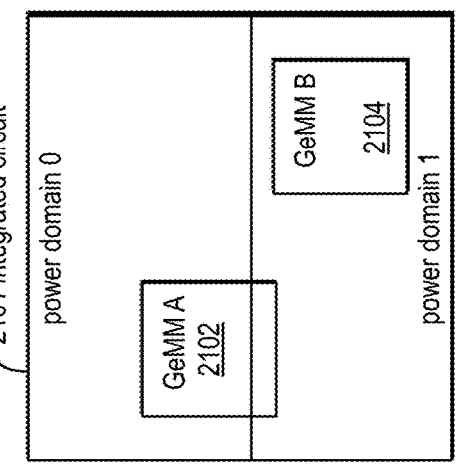

In FIG. 21C, the compiler maps GeMM B to PCUs that are in power domain 1 and maps a portion of GeMM A's PCUs in power domain 0 and the remainder in power domain 1, which may also facilitate an improvement from a performance perspective relative to the mapping of FIGS. 21A and 21B.

In FIG. 21D, the compiler maps GeMM A to some PCUs in power domain 0 and to some PCUs in power domain 1, and similarly the compiler maps GeMM B to some PCUs in power domain 0 and to some PCUs in power domain 1. Hence, some of the PCUs of GeMM A will draw current through the inductive loads associated with power domain 0 and some of the PCUs of GeMM A will draw current through the inductive loads associated with power domain 1; similarly, some of the PCUs of GeMM B will draw current through the inductive loads associated with power domain 0 and some of the PCUs of GeMM B will draw current through the inductive loads associated with power domain 1, which may facilitate a performance improvement relative to the mapping of FIGS. 21A, B, and C, particularly if GeMM B is dependent on results of GeMM A. Assume half the GeMM A PCUs are in power domain 0 and half are in power domain 1. Then, two GeMM A groups of PCUs may start processing concurrently, since they are in separate power domains; then two more GeMM A groups of PCUs may start processing concurrently, and so forth. This enables GeMM A to complete sooner than if all the GeMM A PCUs were in the same power domain. This means that GeMM B will receive its input data from GeMM A sooner than if all GeMM A PCUs were in the same power domain.

Figure 22:
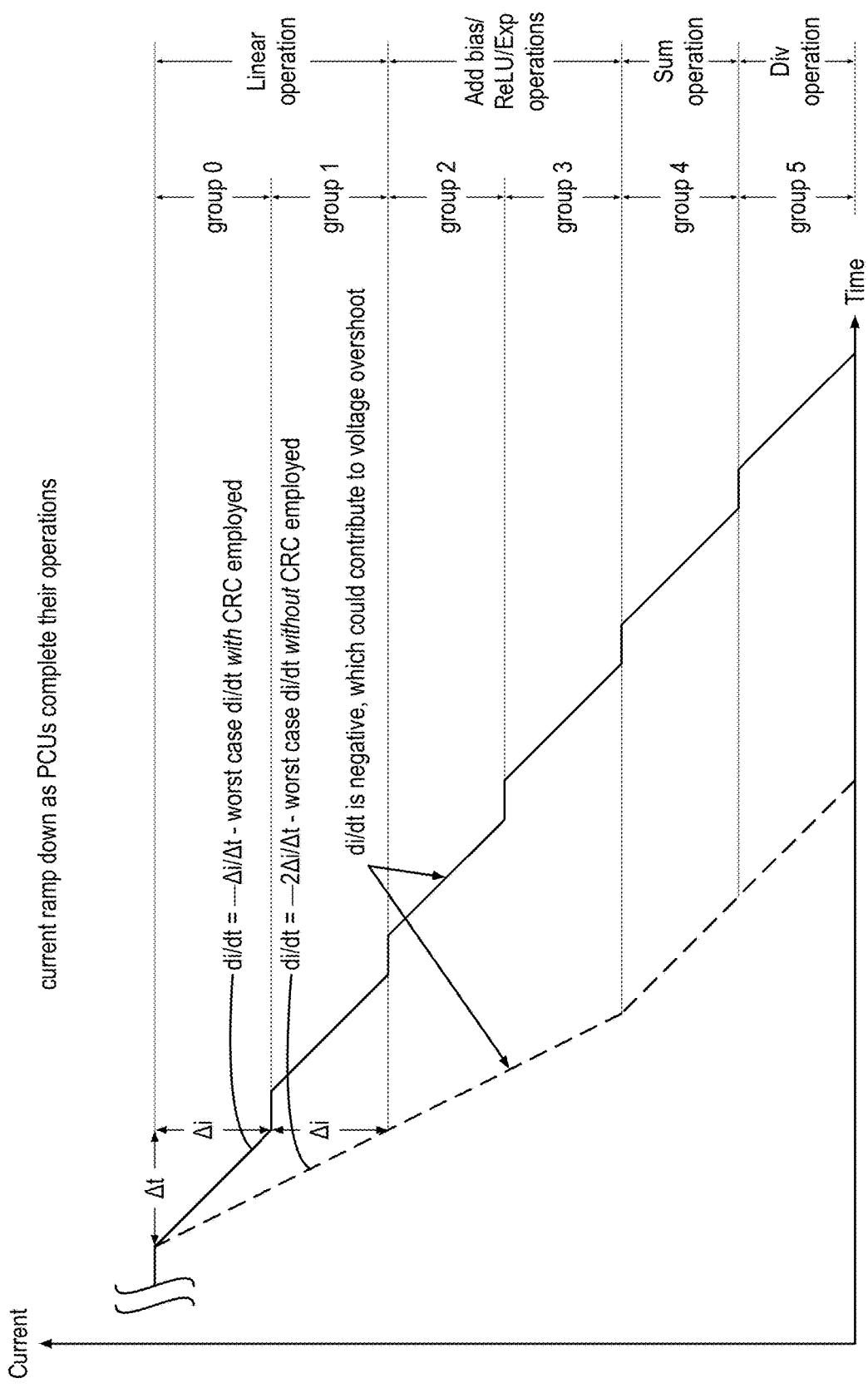
FIG. 22 is an example graph illustrating operation of current ramp control to mitigate voltage overshoot in accordance with embodiments of the present disclosure.

FIG. 22 is an example graph illustrating operation of current ramp control to mitigate voltage overshoot in accordance with embodiments of the present disclosure. FIG. 22 is essentially a continuation of the graph of FIG. 19 that depicts current drawn by the integrated circuit as a function of time, namely a first curve during which the integrated circuit employs an embodiment of CRC (solid curve) and a second curve during which it does not (dashed curve) to facilitate a comparison to illustrate effects of CRC. However, FIG. 22 depicts current ramps during the time in which the aggregate current draw is ramping down as PCUs of the integrated circuit begin to complete their data. In the example of FIG. 22, the PCUs complete processing their data in the same order they started. That is, in the case that CRC is employed, the six PCU groups (groups 0 through 5 of FIG. 18) complete processing their data in the same order in which they started, and in the case that CRC is not employed, the four sets of PCUs mapped to the four operations (Linear, Add bias/ReLU/Exp, Sum, Div of FIG. 18) complete processing their data in the same order in which they started.

In the example of FIG. 18 whose current ramp down is shown in FIG. 22, the 10 PCUs of group 0 complete their data processing, which causes a negative current ramp of $di/dt=-\Delta i/\Delta t$ as the pipeline stages drain and all eventually become inactive, leaving a steady state current draw, as shown. Subsequently, the 10 PCUs of group 1 complete their data processing, which causes a negative current ramp of $di/dt=-\Delta i/\Delta t$ and eventually leaving a steady state current draw. This sequence continues through groups 2, 3, 4, and 5. Thus, $di/dt=-\Delta i/\Delta t$ is the worst case negative current ramp to execute the DFG with CRC employed.

Further in the example, the 20 PCUs mapped to the Linear operation complete their data processing, which causes a negative current ramp of $di/dt=-2\Delta i/\Delta t$ as the pipeline stages drain and all eventually become inactive, leaving a steady state current draw, as shown. Subsequently, the 20 PCUs mapped to the Add bias/ReLu/Exp operations complete their data processing, which causes a negative current ramp of $di/dt=-2\Delta i/\Delta t$ and eventually leaving a steady state current draw. Subsequently, the 10 PCUs mapped to the Sum operation complete their data processing, which causes a negative current ramp of $di/dt=-\Delta i/\Delta t$ and eventually leaving a steady state current draw. Finally, the 10 PCUs mapped to the Div operation complete their data processing, which causes a negative current ramp of $di/dt=-\Delta i/\Delta t$ and eventually leaving a steady state current draw. Thus, $di/dt=-2\Delta i/\Delta t$ is the worst case negative current ramp to execute the DFG with CRC not employed.

As in FIG. 19, the graph of FIG. 22 is an example of the current that may be drawn by the integrated circuit as its data processing completes and is provided for illustration of CRC operation through comparison with operation of the integrated circuit without CRC. However, the current draw over time may be different than shown in FIG. 22 depending on various factors such as whether some of the operations take longer to complete than others, whether there are inactive clock cycles, and whether fewer than all the pipeline stages of the PCUs of an operation are needed to perform the operation. Nevertheless, by predetermining the maximum PCU group size G and the inter-group delay D clock cycles employed in the CRC to mitigate voltage droop, in some cases, such as the example shown in FIG. 22, voltage overshoot caused by negative current ramps through inductive loads may also be mitigated since it may be that the PCU groups complete their data processing in a staggered manner by groups of no more than G PCUs similar to that in which they started their data processing rather than completing their data processing concurrently. In many cases, PCUs perform many operations in a roughly constant amount of time. For example, the multiplication of an M×K matrix and a K×N matrix—i.e., an M×K×N matrix multiplication which represents a significant amount of the operations performed in a neural network—is typically performed over K clock cycles, which may be a relatively large number of clock cycles in the case of a large matrix multiply.

Although embodiments are described in which the current drawn by PCUs—or more precisely the time rate of change of current drawn by PCUs—is primarily considered in deciding the maximum size of a group of PCUs that may concurrently start processing data, other embodiments are contemplated in which the time rate of change of current drawn by PMUs and/or switches in a current wavefront is also considered.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. Omission from some implementations of recitations that repeat these options should not be taken as limiting the combinations taught in the preceding sections—these recitations are hereby incorporated forward by reference into each of the implementations described herein.

Although the description has been described with respect to particular implementations thereof, these particular implementations are merely illustrative, and not restrictive. The description may reference specific structural implementations and methods and does not intend to limit the technology to the specifically disclosed implementations and methods. The technology may be practiced using other features, elements, methods, and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented in a CGRA system, a System-on-Chip (SoC), or application-specific integrated circuit (ASIC). Implementations may be as a single chip, or as a multi-chip module (MCM) that packages multiple semiconductor dies in a single package. All such variations and modifications are to be considered within the ambit of the present disclosed technology the nature of which is to be determined from the foregoing description.

One or more implementations of the technology or elements thereof can be implemented in the form of a computer product, including a non-transitory computer-readable storage medium with computer usable program code for performing any indicated method steps and/or any configuration file for one or more SRDAPs to execute a high-level program. Furthermore, one or more implementations of the technology or elements thereof can be implemented in the form of an apparatus including a memory and at least one processor that is coupled to the memory and operative to perform exemplary method steps, and/or an SRDAP that is operative to execute a high-level program based on a configuration file. Yet further, in another aspect, one or more implementations of the technology or elements thereof can be implemented in the form of means for carrying out one or more of the method steps described herein and/or executing a high-level program described herein. Such means can include (i) hardware module(s); (ii) software module(s) executing on one or more hardware processors; (iii) bit files for configuration of a CGR array; or (iv) a combination of aforementioned items.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope as set forth. Therefore, many modifications may be made to adapt a particular situation or material to the essential scope of the technology disclosed.

To aid the Patent Office and any readers of this application and any patent issued on this application in interpreting the claims appended hereto, applicants wish to indicate they do not intend any of the appended claims or claim elements to invoke 35 U.S.C. § 112(f) unless the words "means for" or "step for" are explicitly used in the particular claim. Furthermore, use of the term "configured to" is not intended to invoke 35 U.S.C. § 112(f). Still further, uses of the terms "unit" or "logic" or "element" are intended to connote structure that is included in an integrated circuit, which includes circuitry configured to perform disclosed operations.

The invention claimed is:

1. An integrated circuit (IC), comprising:
an array of compute units that are statically reconfigurable for separation into mutually exclusive groups, wherein each group includes no more than a statically reconfigurable number of compute units, wherein each compute unit comprises:
a register statically reconfigurable with a group identifier that identifies which group of the mutually exclusive groups the compute unit belongs to;
a counter, statically reconfigurable to synchronously increment with the counters of all the other compute units such that all the counters have the same value each clock cycle; and control circuitry that prevents the compute unit from starting to process data until the counter value matches the group identifier;

wherein according to operation of the register, the counter, and the control circuitry, no more than the statically reconfigurable number of the compute units are allowed to start processing data concurrently to mitigate supply voltage droop caused by a time rate of change of current drawn by the IC through inductive loads of the IC.

2. The IC of claim 1, wherein each compute unit further comprises:

a second counter that increments each clock cycle and resets to zero upon reaching a statically reconfigurable maximum value;

wherein the first counter is incremented by the second counter reaching the statically reconfigurable maximum value; and wherein the statically reconfigurable maximum value specifies a minimum delay in clock cycles between which each group of compute units starts to process data.

3. The IC of claim 2, wherein each compute unit is configured to receive an execute command from a master unit after the IC is statically reconfigured;

wherein each compute unit receives the execute command a variable number of clock cycles after transmission of the execute command by the master unit, and the number of clock cycles varies due to a location of the compute unit within the array relative to the master unit; and wherein the second counter is statically reconfigured with an initial value based on the number of clock cycles associated with the unit so that all the first counters have the same value each clock cycle.

4. The IC of claim 3, wherein the first counter is statically reconfigured with an initial value based on the number of clock cycles associated with the unit so that all the first counters have the same value each clock cycle after all the second counters have reached the statically reconfigurable maximum value at least once.

5. The IC of claim 1, wherein the counter resets to zero after incrementing to a statically reconfigurable group identifier value that corresponds to a last of the mutually exclusive groups.

6. The IC of claim 1, wherein the control circuitry comprises a state machine having inactive, wait, and run states;

wherein the state machine transitions from the inactive state to the wait state in response to an indication that all data dependencies of the compute unit are satisfied;

wherein the state machine transitions from the wait state to the run state in response to the match of the counter value and the group identifier; and wherein control circuitry prevents the compute unit from starting to process data until the state machine enters the run state.

7. The IC of claim 6, wherein each compute unit further comprises:

a second counter that increments each clock cycle in which the compute unit is not processing data;

wherein the state machine transitions from the run state to the inactive state in response to the second counter reaching a statically reconfigurable maximum value.

8. The IC of claim 7, wherein the second counter is reset by a transition from the wait state to the run state; and wherein the second counter is reset by the compute unit processing data.

9. An integrated circuit (IC), comprising:

an array of compute units that are statically reconfigurable for separation into mutually exclusive groups, wherein each compute unit comprises:

a register statically reconfigurable with a group identifier that identifies which group of the mutually exclusive groups the compute unit belongs to;

a first counter that increments each clock cycle and resets to zero when reaching a statically reconfigurable delay value;

a second counter that increments each time the first counter reaches the delay value; and control circuitry that prevents the compute unit from starting to process data until the second counter value matches the group identifier;

wherein according to operation of the register, the first counter, the second counter, and the control circuitry, only one group of the mutually exclusive groups of compute units is allowed to start processing data concurrently within each window of the delay value clock cycles to mitigate supply voltage droop caused by a time rate of change of current drawn by the IC through inductive loads of the IC.

10. The IC of claim 9, wherein each group includes no more than a statically reconfigurable number of compute units.

11. The IC of claim 9, wherein the second counter resets to zero when reaching a statically reconfigurable maximum group identifier value.

12. The IC of claim 9, wherein each compute unit further comprises:

a third counter that increments each clock cycle in which the compute unit is not processing data;

wherein when the third counter reaches a statically reconfigurable maximum value, the control circuitry prevents the compute unit from starting to process data until the second counter value matches the group identifier again.

13. A method, comprising:

in an integrated circuit (IC) comprising an array of compute units that are statically reconfigurable for separation into mutually exclusive groups, wherein each group includes no more than a statically reconfigurable number of compute units, wherein each compute unit comprises a register, a counter, and control circuitry:

statically reconfiguring the register with a group identifier that identifies which group of the mutually exclusive groups the compute unit belongs to;

statically reconfiguring the counter to synchronously increment with the counters of all the other compute units such that all the counters have the same value each clock cycle;

preventing, by the control circuitry, the compute unit from starting to process data until the counter value matches the group identifier; and wherein according to operation of the register, the counter, and the control circuitry, no more than the statically reconfigurable number of the compute units are allowed to start processing data concurrently to mitigate supply voltage droop caused by a time rate of change of current drawn by the IC through inductive loads of the IC.

14. The method of claim 13,
wherein each compute unit further comprises:
a second counter that increments each clock cycle and resets to zero upon reaching a statically reconfigurable maximum value;
wherein the first counter is incremented by the second counter reaching the statically reconfigurable maximum value; and
wherein the statically reconfigurable maximum value specifies a minimum delay in clock cycles between which each group of compute units starts to process data.

15. The method of claim 14, further comprising:
receiving, by each compute unit, an execute command from a master unit after the IC is statically reconfigured;
wherein each compute unit receives the execute command a variable number of clock cycles after transmission of the execute command by the master unit, and the number of clock cycles varies due to a location of the compute unit within the array relative to the master unit; and
statically reconfiguring the second counter with an initial value based on the number of clock cycles associated with the unit so that all the first counters have the same value each clock cycle.

16. The method of claim 15, further comprising:
statically reconfiguring the first counter with an initial value based on the number of clock cycles associated with the unit so that all the first counters have the same value each clock cycle after all the second counters have reached the statically reconfigurable maximum value at least once.

17. The method of claim 13, further comprising:
resetting the counter to zero after incrementing to a statically reconfigurable group identifier value that corresponds to a last of the mutually exclusive groups.

18. The method of claim 13, further comprising:
wherein the control circuitry comprises a state machine having inactive, wait, and run states;
transitioning the state machine from the inactive state to the wait state in response to an indication that all data dependencies of the compute unit are satisfied;
transitioning the state machine from the wait state to the run state in response to the match of the counter value and the group identifier; and
preventing, by the control circuitry, the compute unit from starting to process data until the state machine enters the run state.

19. The method of claim 18, further comprising:
wherein each compute unit further comprises:
a second counter that increments each clock cycle in which the compute unit is not processing data;
transitioning the state machine from the run state to the inactive state in response to the second counter reaching a statically reconfigurable maximum value.

20. The method of claim 19, further comprising:
resetting the second counter by a transition from the wait state to the run state; and
resetting the second counter by the compute unit processing data.

21. A method, comprising:
in an integrated circuit (IC) comprising an array of compute units that are statically reconfigurable for separation into mutually exclusive groups, wherein each compute unit comprises a register, a first counter, a second counter, and control circuitry:
statically reconfiguring a register with a group identifier that identifies which group of the mutually exclusive groups the compute unit belongs to;
incrementing a first counter each clock cycle and resetting the first counter to zero when reaching a statically reconfigurable delay value;
incrementing a second counter each time the first counter reaches the delay value; and
preventing, by the control circuitry, the compute unit from starting to process data until the second counter value matches the group identifier;
wherein according to operation of the register, the first counter, the second counter, and the control circuitry, only one group of the mutually exclusive groups of compute units is allowed to start processing data concurrently within each window of the delay value clock cycles to mitigate supply voltage droop caused by a time rate of change of current drawn by the IC through inductive loads of the IC.

22. The method of claim 21,
wherein each group includes no more than a statically reconfigurable number of compute units.

23. The method of claim 21, further comprising:
resetting the second counter to zero when reaching a statically reconfigurable maximum group identifier value.

24. The method of claim 21, further comprising:
wherein each compute unit further comprises:
a third counter that increments each clock cycle in which the compute unit is not processing data;
preventing, by the control circuitry when the third counter reaches a statically reconfigurable maximum value, the compute unit from starting to process data until the second counter value matches the group identifier again.

25. A non-transitory computer-readable storage medium having computer program instructions stored thereon that are capable of causing or configuring an integrated circuit (IC), the IC comprising:
an array of compute units that are statically reconfigurable for separation into mutually exclusive groups, wherein each group includes no more than a statically reconfigurable number of compute units, wherein each compute unit comprises:
a register statically reconfigurable with a group identifier that identifies which group of the mutually exclusive groups the compute unit belongs to;
a counter, statically reconfigurable to synchronously increment with the counters of all the other compute units such that all the counters have the same value each clock cycle; and
control circuitry that prevents the compute unit from starting to process data until the counter value matches the group identifier;
wherein according to operation of the register, the counter, and the control circuitry, no more than the statically reconfigurable number of the compute units are allowed to start processing data concurrently to mitigate supply voltage droop caused by a time rate of change of current drawn by the IC through inductive loads of the IC.

26. A non-transitory computer-readable storage medium having computer program instructions stored thereon that are capable of causing or configuring an integrated circuit (IC), the IC comprising:
- an array of compute units that are statically reconfigurable for separation into mutually exclusive groups, wherein each compute unit comprises:
- a register statically reconfigurable with a group identifier that identifies which group of the mutually exclusive groups the compute unit belongs to;
- a first counter that increments each clock cycle and resets to zero when reaching a statically reconfigurable delay value;
- a second counter that increments each time the first counter reaches the delay value; and
- control circuitry that prevents the compute unit from starting to process data until the second counter value matches the group identifier;
- wherein according to operation of the register, the first counter, the second counter, and the control circuitry, only one group of the mutually exclusive groups of compute units is allowed to start processing data concurrently within each window of the delay value clock cycles to mitigate supply voltage droop caused by a time rate of change of current drawn by the IC through inductive loads of the IC.

* * * * *